US012563918B2

(12) United States Patent (10) Patent No.: US 12,563,918 B2
Chen et al. (45) Date of Patent: Feb. 24, 2026

(54) FLEXIBLE DISPLAY PANEL AND MANUFACTURING METHOD THEREFOR, DISPLAY APPARATUS, AND TILED DISPLAY APPARATUS

(71) Applicants:CHENGDU BOE OPTOELECTRONICS TECHNOLOGY CO., LTD., Sichuan (CN); BOE TECHNOLOGY GROUP CO., LTD., Beijing (CN)

(72) Inventors: Wenbo Chen, Beijing (CN); Yuhsiung Feng, Beijing (CN); Xin Mou, Beijing (CN); Chenyu Chen, Beijing (CN); Hongting Lu, Beijing (CN); Zhongliu Yang, Beijing (CN); Shuang Zhao, Beijing (CN); Jing Yang, Beijing (CN); Lian Xiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 647 days.

(21) Appl. No.: 17/796,440

(22) PCT Filed: Aug. 9, 2021

(86) PCT No.: PCT/CN2021/111510
§ 371 (c)(1),
(2) Date: Jul. 29, 2022

(87) PCT Pub. No.: WO2022/062732
PCT Pub. Date: Mar. 31, 2022

(65) Prior Publication Data
US 2023/0118191 A1 Apr. 20, 2023

(30) Foreign Application Priority Data

Sep. 27, 2020 (CN) .......................... 202011032674.1

(51) Int. Cl.
*H10K 59/131* (2023.01)
*H10K 59/12* (2023.01)
*H10K 102/00* (2023.01)

(52) U.S. Cl.
CPC ....... *H10K 59/131* (2023.02); *H10K 59/1201* (2023.02); *H10K 2102/311* (2023.02)

(58) Field of Classification Search
CPC .... G09G 3/32–3291; G09G 2300/0842–0852; G09G 2300/0861;
(Continued)

(56) References Cited

U.S. PATENT DOCUMENTS 4,414,490 A * 11/1983 Harvey ................. H01J 17/494
315/169.4
10,910,410 B2 2/2021 Zhu
(Continued)

FOREIGN PATENT DOCUMENTS

CN 108231854 A * 6/2018 ......... H01L 27/3276
CN 108766979 A 11/2018
(Continued)

OTHER PUBLICATIONS

PCT International Search Report (w/ English translation) and Written Opinion for PCT Application No. PCT/CN2021/111510, mailed on Nov. 9, 2021, 12 pages.
(Continued)

*Primary Examiner* — William B Partridge
*Assistant Examiner* — Chevy J Boegel
(74) *Attorney, Agent, or Firm* — Dority & Manning, P.A.

(57) ABSTRACT
A flexible display panel has a display area and a peripheral area located around the display area. The peripheral area
(Continued)

includes at least one bendable region and a foldable region located on a side of each bendable region away from the display area. The flexible display panel includes a flexible substrate, and a bezel circuit that is disposed on the flexible substrate and located in the peripheral area. At least a portion of the bezel circuit is located in the foldable area. A portion of the flexible display panel located in the foldable region is configured to be folded toward a direction away from a display side of the flexible display panel through a portion of the flexible display panel located in the bendable region.

18 Claims, 17 Drawing Sheets

(58) Field of Classification Search
CPC .. H10K 59/131; H10K 59/1201; H10K 71/00; H10K 2102/311; H10K 77/111; Y02E 10/549; H01L 21/77
See application file for complete search history.

(56) References Cited

U.S. PATENT DOCUMENTS

| | | | |
|---|---|---|---|
| 11,424,227 B2 | 8/2022 | Liu et al. | |
| 2009/0230397 A1* | 9/2009 | Noda | H10D 86/60 257/E21.535 |
| 2018/0063942 A1 | 3/2018 | Kim et al. | |
| 2019/0244976 A1* | 8/2019 | Zhu | H10D 86/411 |
| 2020/0209925 A1* | 7/2020 | Paek | H10K 77/111 |
| 2020/0243019 A1* | 7/2020 | Morita | G09G 3/3266 |
| 2022/0005908 A1 | 1/2022 | Ming et al. | |

FOREIGN PATENT DOCUMENTS

| | | | | |
|---|---|---|---|---|
| CN | 109240013 A | | 1/2019 | |
| CN | 110379322 A | * | 10/2019 | G09F 9/301 |
| CN | 111508935 A | | 8/2020 | |
| WO | WO-2021027247 A1 | * | 2/2021 | G09F 9/301 |

OTHER PUBLICATIONS

Chinese Office Action (with English translation) received in corresponding Application No. CN 202011032674.1, dated May 16, 2025, 17 pages.

* cited by examiner

1

Second
direction

First
direction

1

1

FLEXIBLE DISPLAY PANEL AND MANUFACTURING METHOD THEREFOR, DISPLAY APPARATUS, AND TILED DISPLAY APPARATUS

CROSS-REFERENCE TO RELATED APPLICATIONS

This application is a national phase entry under 35 USC 371 of International Patent Application No. PCT/CN2021/111510 filed on Aug. 9, 2021, which claims priority to Chinese Patent Application No. 202011032674.1, filed on Sep. 27, 2020, which are incorporated herein by reference in their entirety,

TECHNICAL FIELD

The present disclosure relates to the field of display technologies, and in particular, to a flexible display panel and a manufacturing method therefor, a display apparatus and a tiled display apparatus.

BACKGROUND

A flexible display panel, also referred to as a rollable display panel, is a display panel that is made of a flexible material and can be bent and deformed.

At present, a mainstream flexible organic light-emitting diode (OLED) display panel includes a flexible substrate, a thin film transistor layer, an OLED device layer, a thin film encapsulation layer, etc. A material of the flexible substrate is, for example, polyimide (PI).

SUMMARY

In one aspect, a display panel is provided. The display panel has a display area and a peripheral area located around the display area. The peripheral area includes at least one bendable region and a foldable region located on a side of each bendable region away from the display area. The flexible display panel includes a flexible substrate, and a bezel circuit that is disposed on the flexible substrate and located in the peripheral area, and at least a portion of the bezel circuit is located in the foldable area. A portion of the flexible display panel located in the foldable region is configured to be folded toward a direction away from a display side of the flexible display panel through a portion of the flexible display panel located in the bendable region.

In some embodiments, the bezel circuit at least includes a cathode signal line, and at least a portion of the cathode signal line is located in the foldable region.

In some embodiments, the bezel circuit includes: a plurality of signal lines and at least one circuit group that are disposed on the flexible substrate. A circuit group includes at least one gate driving circuit located in the foldable region, and the at least one gate driving circuit is configured to connect at least some of the plurality of signal lines.

In some embodiments, the bezel circuit includes a cathode signal line, and the circuit group is located on a side of the cathode signal line proximate to the bendable region.

In some embodiments, the at least some of the plurality of signal lines include a plurality of gate lines and a plurality of light-emitting control signal lines.

The circuit group includes a first gate driving circuit and a second gate driving circuit arranged side by side in a first direction, the first gate driving circuit is configured to connect the plurality of gate lines, and the second gate driving circuit is configured to connect the plurality of light-emitting control signal lines. The first direction is an extending direction of the gate lines.

In some embodiments, the at least some of the plurality of signal lines further include a plurality of first reset signal lines, the circuit group further includes a third gate driving circuit, the third gate driving circuit is arranged side by side with the first gate driving circuit and the second gate driving circuit in the first direction, and the third gate driving circuit is configured to connect the plurality of first reset signal lines.

In some embodiments, the at least some of the plurality of signal lines further include a plurality of second reset signal lines, the circuit group further includes a fourth gate driving circuit, the fourth gate driving circuit is arranged side by side with the first date driving circuit and the second date driving circuit in the first direction, and the fourth gate driving circuit is configured to connect the plurality of second reset signal lines.

In some embodiments, the cathode signal line is arranged around the display area; or the display area is in a shape of a rectangle, and the cathode signal line is arranged around three sides of the display area.

In some embodiments, a width of the bendable region is in a range of 1.0 mm to 1.5 mm, inclusive. The bezel circuit includes a cathode signal line, and a width of the cathode signal line is in a range of 2.0 mm to 3.5 mm, inclusive.

In some embodiments, of the plurality of signal lines, a portion of at least one signal line located in the bendable region includes a plurality of holes arranged at intervals.

In some embodiments, the plurality of holes include at least two rows of holes arranged in the first direction, and orthogonal projections of any two holes located in different rows on the flexible substrate are non-overlapping.

In some embodiments, an outer contour of the portion of the at least one signal line located in the bendable region includes connected arcs and/or fold lines.

In some embodiments, the flexible display panel further includes a plurality of insulating layers disposed on the flexible substrate. A material of each insulating layer is an inorganic material, at least one insulating layer of the plurality of insulating layers includes at least one groove located in the bendable region therein, and the at least one groove is filled with an organic material.

In some embodiments, the at least one groove includes a plurality of grooves, and the plurality of grooves extend in a thickness direction of the flexible substrate, and distributed in a direction perpendicular to the thickness direction of the flexible substrate, and orthogonal projections of the plurality of grooves on the flexible substrate are non-overlapping.

In some embodiments, the flexible display panel further includes at least one planarization layer disposed on a side of the insulating layers away from the flexible substrate, the at least one planarization layer covering the groove.

In another aspect, a display apparatus is provided. The display apparatus includes the flexible display panel in any one of the above embodiments.

In yet another aspect, a tiled display apparatus is provided. The tiled display apparatus includes a plurality of flexible display panels in any one of the above embodiments. Of two adjacent flexible display panels, at least one flexible display panel includes a bendable region and a foldable region on a side thereof proximate to another flexible display panel, and the foldable region is located on a non-display side of the flexible display panel.

In yet another aspect, a method for manufacturing a flexible display panel is provided. The flexible display panel has a display area and a peripheral area located around the display area. The peripheral area includes at least one bendable region and a foldable region located on a side of each bendable region away from the display area.

The method for manufacturing the flexible display panel includes:

forming a plurality of insulating layers on a flexible substrate, a material of each insulating layer being an inorganic material;

removing a portion of at least one insulation layer of the plurality of insulation layers located in the bendable region to form a groove;

filling the at least one groove with an organic material; and forming a bezel circuit on the flexible substrate, at least a portion of the bezel circuit being located in the foldable region.

In some embodiments, forming the bezel circuit on the flexible substrate includes: forming a cathode signal line on the flexible substrate, at least a portion of the cathode signal line being located in the foldable region.

In some embodiments, forming the bezel circuit on the flexible substrate further includes: forming a plurality of signal lines and at least one circuit group on the flexible substrate. A circuit group includes at least one gate driving circuit located in the foldable region, the at least one gate driving circuit is configured to connect at least some of the plurality of signal lines, and the plurality of signal lines are formed in synchronization with a gate layer of thin film transistors in the gate driving circuit.

In some embodiments, forming the cathode signal line on the flexible substrate includes forming the cathode signal line on a side of the circuit group away from the display area.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure are related.

DETAILED DESCRIPTION

Figure 1A:
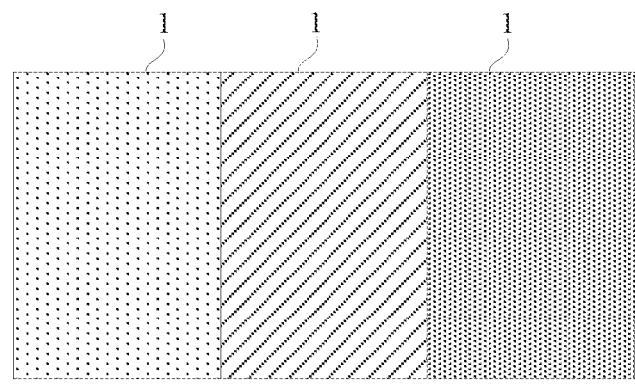
FIG. 1A is a top view showing a structure of a tiled display apparatus, in accordance with some embodiments of the present disclosure.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, "a plurality of/the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B, and C" has the same meaning as the phrase "at least one of A, B, or C", and both include the following combinations of A, B, and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when" or "in a case where" or "in response to determining that" or "in response to detecting". Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

Additionally, the use of "based on" is meant to be open and inclusive, since a process, step, calculation, or other action "based on" one or more recited conditions or values may, in practice, be based on additional conditions or value other than those recited.

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown to have a rectangular shape generally has feature of being curved. Therefore, the regions shown in the accompanying drawings are schematic in nature, and their shapes are not intended to show actual shapes of the regions in a device, and are not intended to limit the scope of the exemplary embodiments.

Figure 1B:
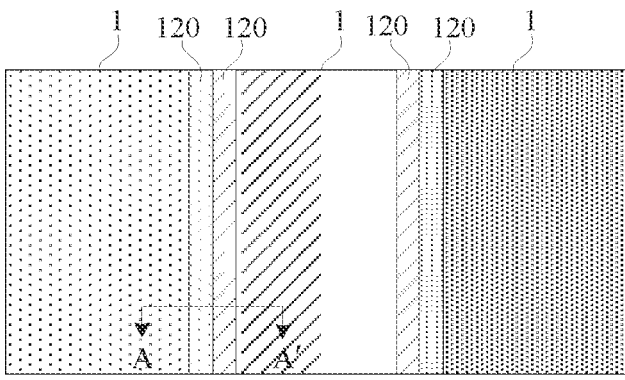
FIG. 1B is a bottom view showing a structure of a tiled display apparatus, in accordance with some embodiments of the present disclosure.
Figure 1C:
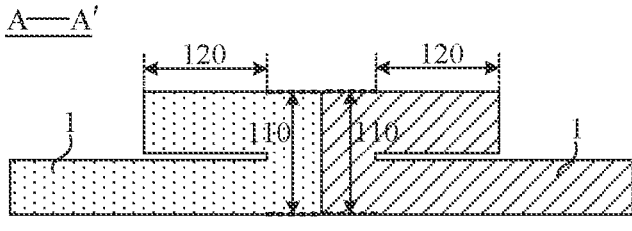
FIG. 1C is a sectional view taken along the line A-A' of FIG. 1B.

Referring to FIGS. 1A to 1C, the present disclosure provides a tiled display apparatus. The tiled display apparatus includes a plurality of display apparatuses tiled together, and the plurality of display apparatuses are, for example, organic light-emitting diode (OLED) display apparatuses. Each display apparatus includes a flexible display panel 1. Of two adjacent flexible display panels 1, at least one flexible display panel 1 is provided with a bendable region 110 (not shown in FIG. 1B due to its small size) and a foldable region 120 on a side thereof proximate to the other flexible display panel 1, and the foldable region 120 is located on a non-display side of the flexible display panel 1. A portion of the flexible display panel 1 located in the foldable region 120 is configured to be folded toward a direction away from a display side of the flexible display panel 1 through a portion thereof located in the bendable region 110. The display side of the flexible display panel 1 is a side of the flexible display panel 1 that is capable of displaying an image, and the non-display side and the display side are opposite in a thickness direction of the flexible display panel 1. The display side of the flexible display panel 1 may also be referred to as a front surface of the flexible display panel 1, and the non-display side of the flexible display panel 1 may also be referred to as a back surface of the flexible display panel 1.

Referring to FIGS. 1B and 1C, the two adjacent flexible display panels 1 are next to each other. Of the two adjacent flexible display panels 1, the at least one flexible display panel 1 being provided with the bendable region 110 and the foldable region 120 on the side thereof proximate to the another flexible display panel 1 includes: the two adjacent flexible display panels 1 each including a bendable region 110 and a foldable region 120, and any one of the two adjacent flexible display panels 1 including the bendable region 110 and the foldable region 120. Referring to FIGS. 1B and 1C, the portion of the flexible display panel 1 located in the foldable region 120 may be folded to the non-display side of the flexible display panel 1 through the portion thereof located in the bendable region 110, so that a bezel of the flexible display panel 1 is narrow. The bezel is in a non-display area. Therefore, the narrower the bezel of the flexible display panel 1, the smaller a sum of widths of two adjacent bezels of the two adjacent flexible display panels 1. As a result, a width of a non-display area between display areas 10 of the two adjacent flexible display panels 1 (which is equal to the sum of the widths of the two adjacent bezels of the two adjacent flexible display panels 1) is small, continuity of an image displayed by the two flexible display panels 1 in the tiled display apparatus is good, and a display effect of the tiled display apparatus is good.

Referring to FIGS. 2A to 2E, the flexible display panel 1 has a display area 10 and a peripheral area 11 located around the display area 10. The peripheral area 11 includes at least one bendable region 110 and a foldable region 120 located on a side of each bendable region 110 away from the display area 10. That is, the bendable region 110 and the foldable region 120 are in one-to-one correspondence.

Figure 2A:
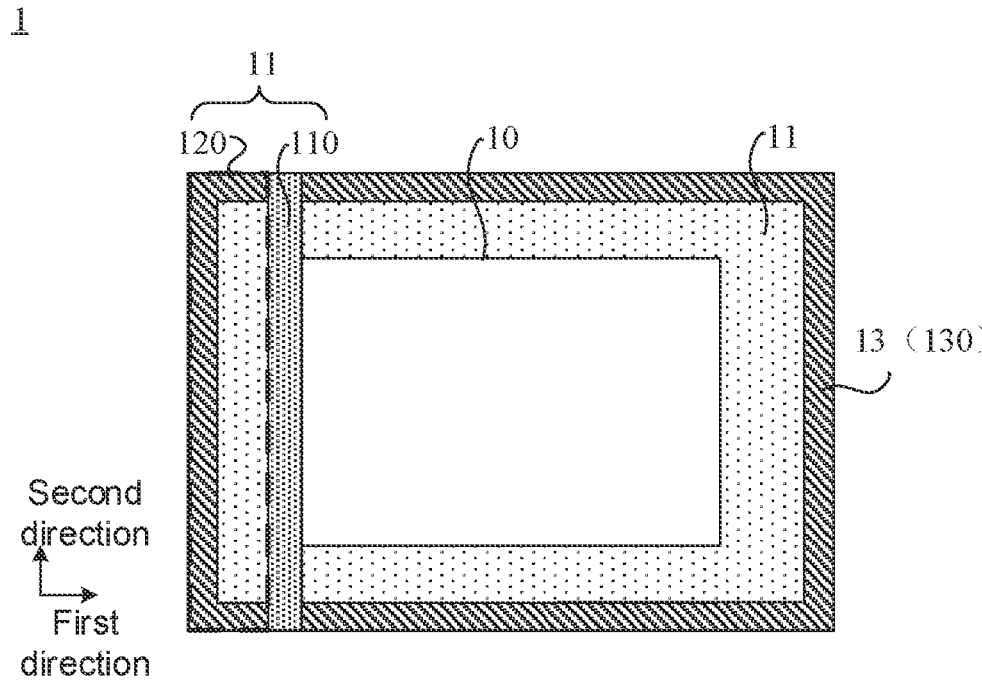
FIGS. 2A to 2E are each a diagram showing a structure of a flexible display panel, in accordance with some embodiments of the present disclosure.
Figure 2B:
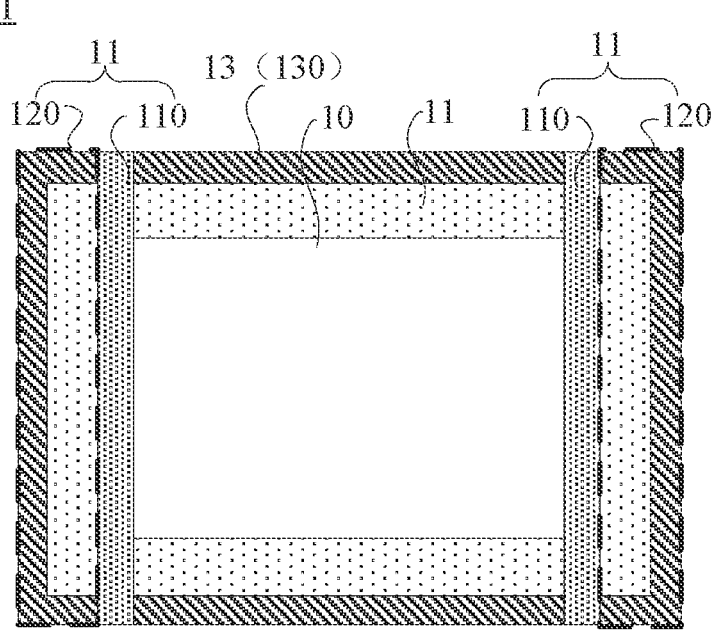
Figure 2C:
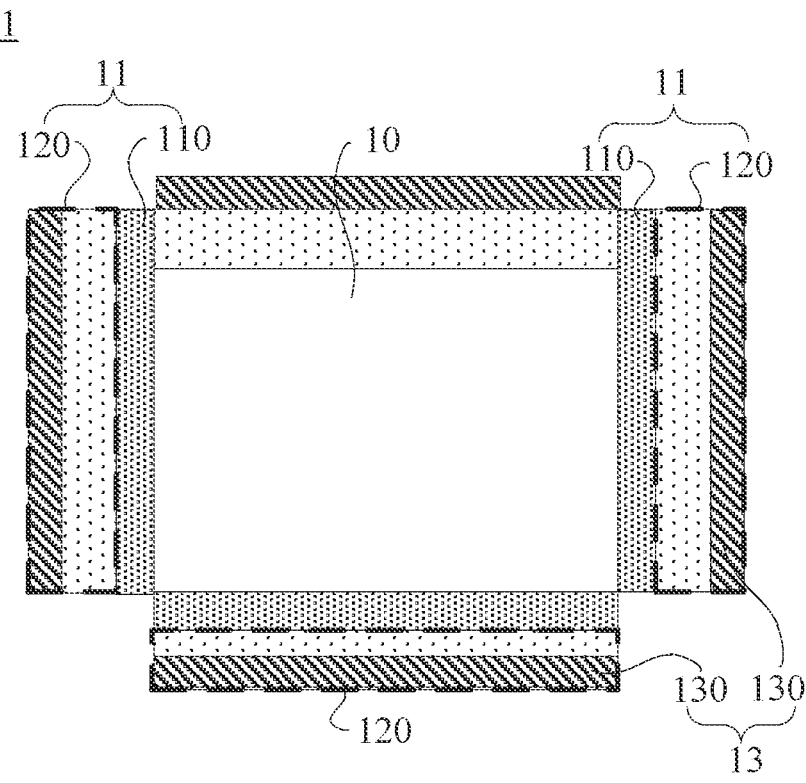
Figure 2D:
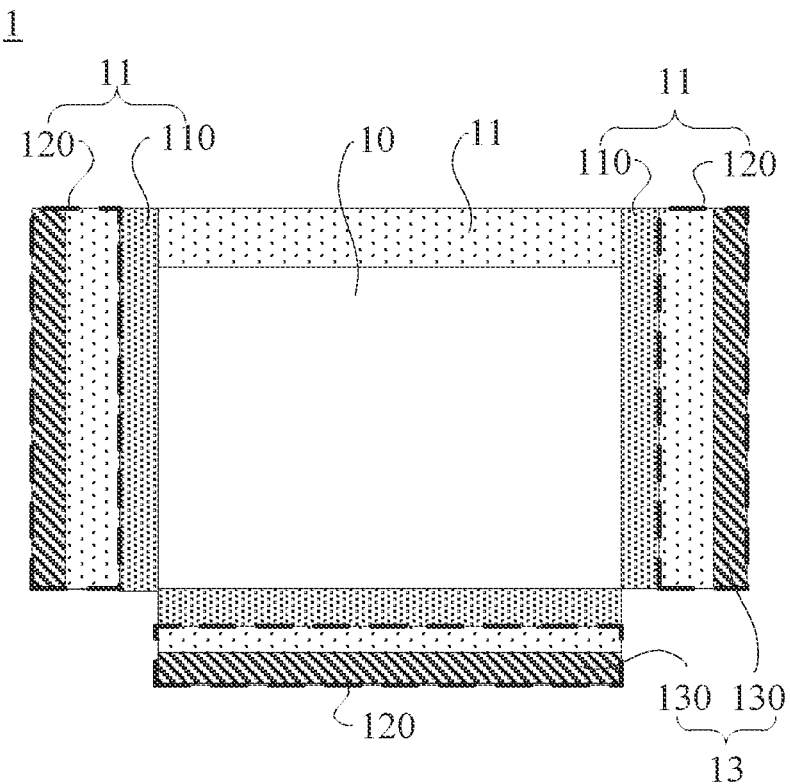
Figure 2E:
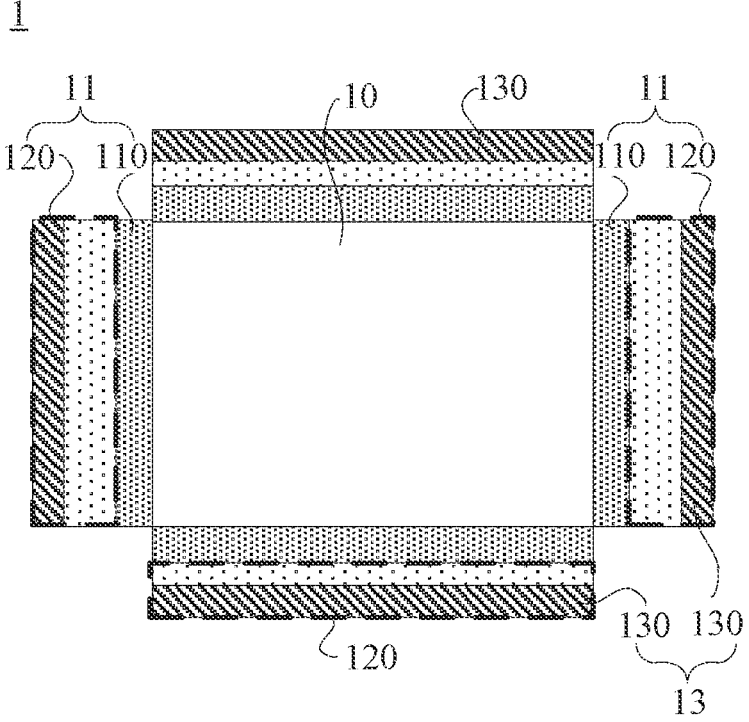

Referring to FIG. 2A, the flexible display panel 1 includes a pair of bendable region 110 and foldable region 120, and the bendable region 110 and the foldable region 120 are arranged side by side in a first direction. The first direction is, for example, a length direction of the flexible display panel 1. Referring to FIG. 2B, the flexible display panel 1 includes two pairs of bendable regions 110 and foldable regions 120. one pair of bendable region 110 and foldable region 120 and the other pair of bendable region 110 and foldable region 120 are located on two opposite sides of the flexible display panel 1 in the length direction. Referring to FIGS. 2C and 2D, the flexible display panel 1 includes three pairs of bendable regions 110 and foldable regions 120. The display area 10 of the flexible display panel 1 is in a shape of a rectangle, and the three pairs of bendable regions 110 and foldable regions 120 are located on three sides outside the display area 10. Referring to FIG. 2E, the flexible display panel 1 includes four pairs of bendable regions 110 and foldable regions 120. The display area 10 of the flexible display panel 1 is in the shape of the rectangle, and each side of the peripheral area 11 around the display area 10 is provided with a pair of bendable region 110 and foldable region 120.

The flexible display panel 1 includes a flexible substrate and a bezel circuit 13 that is disposed on the flexible substrate and located in the peripheral area 11. At least a portion of the bezel circuit 13 is located in the foldable region 120.

The bezel circuit 13 is located in the peripheral area, and is disposed on the display side of the flexible display panel 1. The bezel circuit 13 is configured to provide driving signals for the flexible display panel 1, and the driving signals includes, for example, a cathode signal, a scanning signal, and the like.

On this basis, in some embodiments, referring to FIGS. 2A to 2D, the bezel circuit 13 at least includes a cathode signal line 130. At least a portion of the cathode signal line 130 is located in the foldable region 120, and the cathode signal line 130 may provide the cathode signal.

For example, referring to FIGS. 2A to 2C, a portion of the cathode signal line 130 is located in the foldable region 120; and referring to FIGS. 2D and 2E, all of the cathode signal line 130 is located in the foldable regions 120. A specific structure of the cathode signal line 130 is related to a size of the flexible display panel 1. In a case where the flexible display panel 1 is a small sized display panel 1 such as a mobile phone screen, the structure of the cathode signal line 130 is, for example, shown in FIG. 2D. In a case where the flexible display panel 1 is a medium-to-large sized display panel 1 such as a display panel of a television, the structure of the cathode signal line 130 is, for example, shown in FIGS. 2A to 2C and 2E. For example, the medium-to-large size display panel 1 is, for example, a display panel 1 of 12.3 inches.

Figure 3:
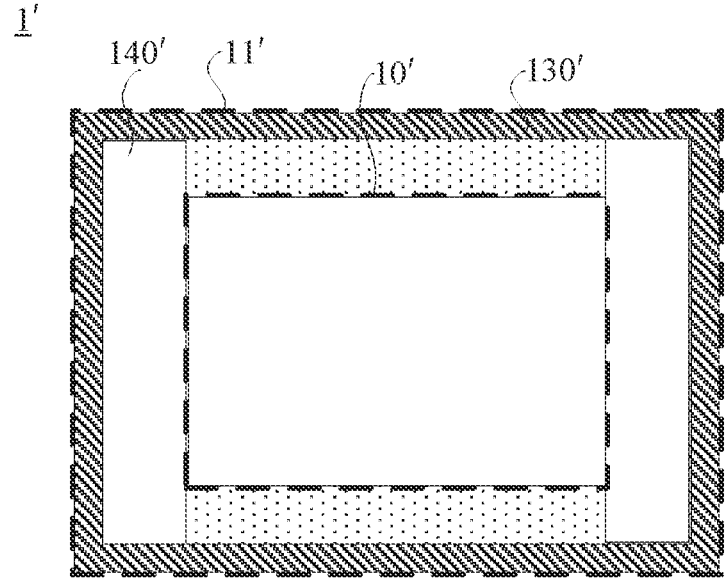
FIG. 3 is a diagram showing a structure of a flexible display panel, in accordance with some embodiments of the related art.

Referring to FIG. 3, a flexible display panel 1' in the related art has a display area 10' and a peripheral area 11', and the peripheral area 11' is arranged around the display area 10'. For example, a cathode signal line 130' and a gate driving circuit 140' are provided in the peripheral area 11' in the related art. Due to a large load of the flexible display panel 1', in order to ensure a display effect, there is a need to ensure that a width of the cathode signal line 130' is not too small. However, in a case where the width of the cathode signal line 130' is large, a width of the peripheral area 11' of the flexible display panel 1' is also large. The larger the width of the peripheral area 11', the larger a bezel width of the flexible display panel 1'. The bezel width of the flexible display panel 1' is large, which does not conform to a industry trend of development toward a narrow bezel of the flexible display panel 1'; furthermore, in a case where a plurality of flexible display panels 1' are tiled together to form a tiled display apparatus, a width of a non-display area between two display areas 10' of two adjacent flexible display panels 1' is large. As a result, an effect of seamless splicing of the plurality of flexible display panels 1' may not be achieved, and a display effect of the tiled display apparatus is poor.

By contrast, the present disclosure provides the display apparatus and the flexible display panel 1. The peripheral area 11 of the flexible display panel 1 includes the at least one bendable region 110 and a foldable region 120 located on a side of each bendable region 110 away from the display area 10. At least the portion of the bezel circuit 13 is located in the foldable region 120, and the portion of the flexible display panel 1 located in the foldable region 120 is configured to be folded toward the direction away from the display side of the flexible display panel 1 through the portion thereof located in the bendable region 110. Therefore, at least the portion of the bezel circuit 13 may be folded to the non-display side of the flexible display panel 1. The peripheral area 11 in the present disclosure includes the bendable region 110 and the foldable region 120, so that a portion of the flexible display panel 1 located in the bendable region 110 may be bent, and a portion of the flexible display panel 1 located in the foldable region 120 may be folded to the non-display side of the flexible display panel 1. After the portion of the flexible display panel 1 located in the foldable region 120 is folded to the non-display side of the flexible display panel 1, the bezel width of the flexible display panel 1 may be reduced, so that the flexible display panel 1 conforms to the industry development trend of the narrow bezel. And in a case where the plurality of flexible display panels 1 are tiled together to form the tiled display apparatus, the width of the non-display area between the two display areas 10 of the two adjacent flexible display panels 1 is small. Therefore, the effect of seamless splicing of the plurality of flexible display panels 1 may be achieved, and the display effect of the tiled display apparatus may be improved.

Figure 4A:
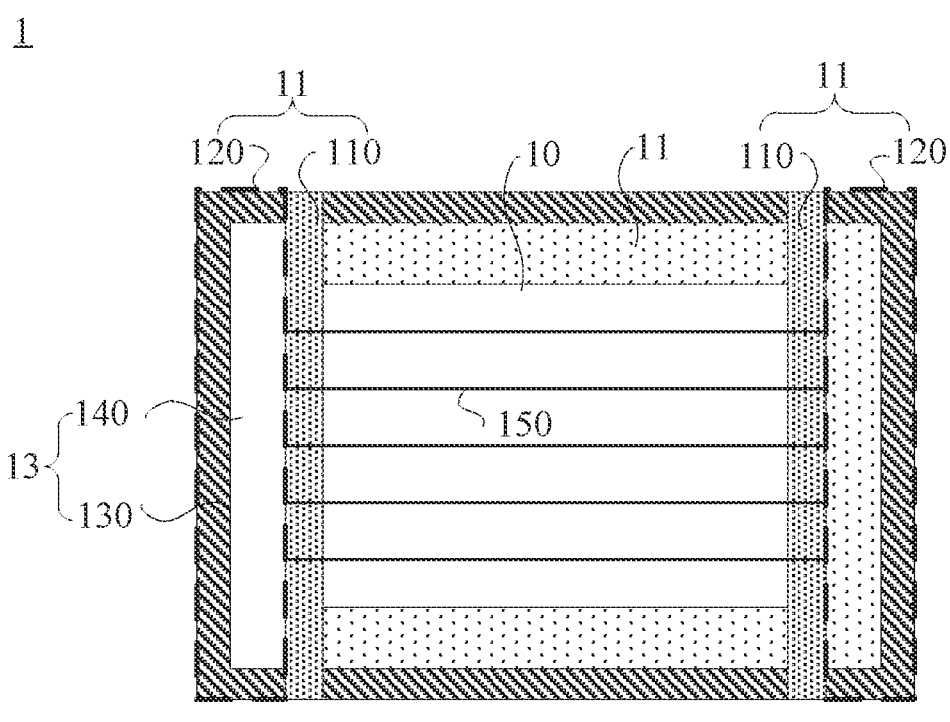
FIGS. 4A to 4C are each a diagram showing a structures of another flexible display panel, in accordance with some embodiments of the present disclosure.
Figure 4B:
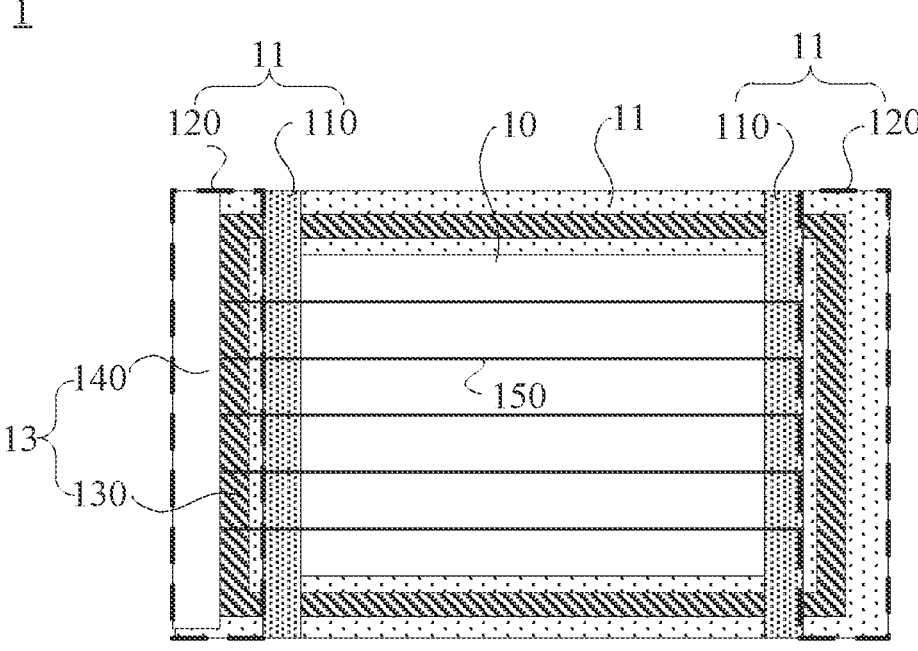
Figure 4C:
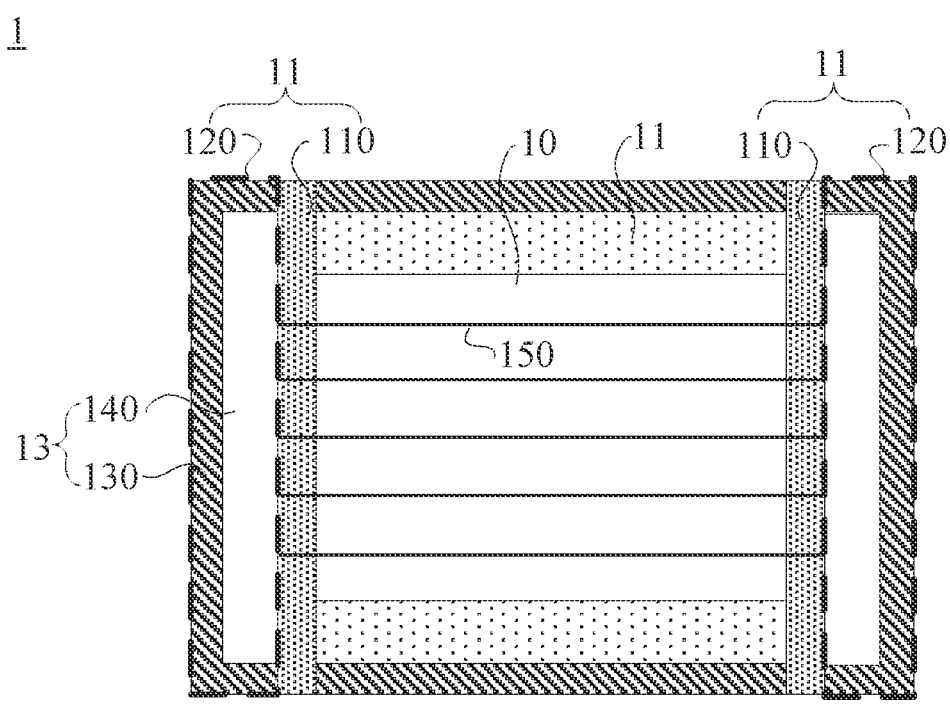

In some embodiments, as shown in FIGS. 4A to 4C, the bezel circuit 13 further includes a plurality of signal lines 150 and at least one circuit group 140. A circuit group 140 includes at least one gate driving circuit located in the foldable region 120, and the at least one gate driving circuit is configured to connect a plurality of signal lines 150.

Figure 4D:
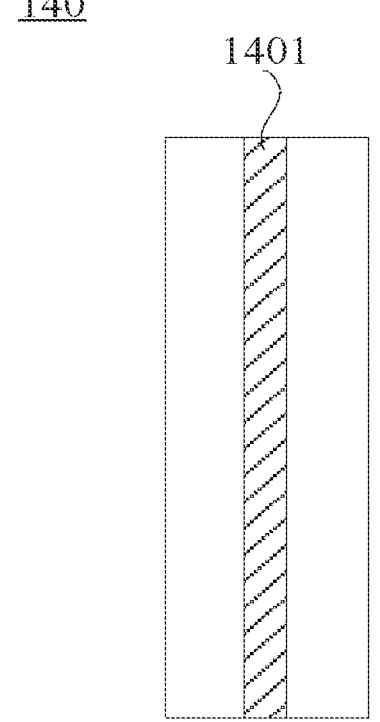
FIG. 4D is a diagram showing a structure of a circuit group, in accordance with some embodiments of the present disclosure.
Figure 4E:
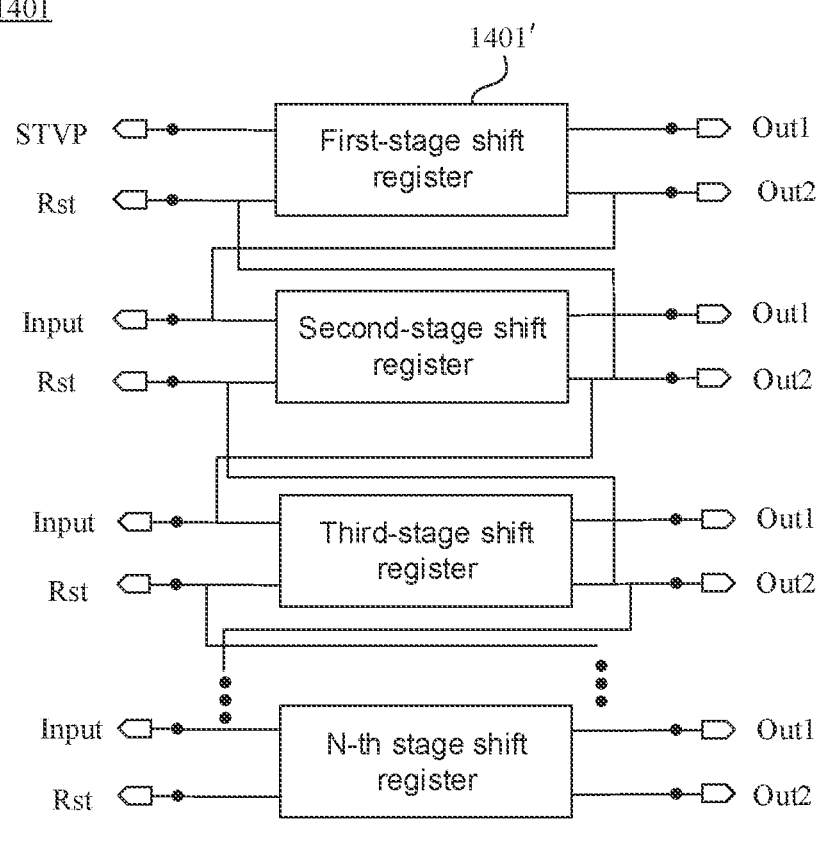
FIG. 4E is a diagram showing a structure of a first gate driving circuit, in accordance with some embodiments of the present disclosure.

Referring to FIGS. 4D and 4E, the circuit group 140 includes a gate driving circuit, and the gate driving circuit is, for example, a first gate driving circuit 1401. The first gate driving circuit 1401 includes a plurality of shift registers 1401' connected in cascade.

The flexible display panel 1 further includes a plurality of sub-pixels, and each sub-pixel is provided therein with a pixel driving circuit. An output terminal of each stage shift register 1401' in the first gate driving circuit 1401 is used to be electrically connected to pixel driving circuits in a same row of sub-pixels, and provides a gate driving signal for the pixel driving circuits. The gate driving signal is a type of scanning signals.

Referring to FIG. 4E, in n (n being a positive integer greater than or equal to 2) cascaded shift registers 1401', a second output signal terminal Out2 of a first-stage shift register is electrically connected to an input signal terminal Input of a second-stage shift register.

A second output signal terminal Out2 of an nth stage shift register is electrically connected to a reset signal terminal Rst of an (n−1)-th stage shift register.

Other than the first stage shift register and the nth stage shift register, second output signal terminals Out2 of other shift registers is each electrically connected to a reset signal terminal Rst of a previous-stage shift register and an input signal terminal Input of a next-stage shift register.

A signal received by the input signal terminal of the first stage shift register is a start signal STVP, and a first output signal terminal Out1 of each stage shift register 1401' is used to be electrically connected to pixel driving circuits.

The circuit group 140 is located in the foldable region 120, and the circuit group 140 includes the at least one gate driving circuit. Therefore, in some embodiments of the present disclosure, the at least one gate driving circuit may be folded to the non-display side of the flexible display panel 1, thereby reducing the bezel width of the flexible display panel 1.

In some embodiments, referring to FIGS. 4A and 4C, the circuit group 140 is located on a side of the cathode signal line 130 proximate to the bendable region 110. In this structure, an area of the entire cathode signal line 130 is large, and the cathode signal line 130 is used to be electrically connected to a cathode layer in the flexible display panel 1 to provide an electrical signal for the cathode layer. Therefore, the larger the area of the cathode signal line 130, the smaller the total impedance of the cathode signal line 130 and the cathode layer, and the smaller the voltage drop of the electrical signal transmitted from the cathode signal line 130 to the cathode layer, which is conducive to reducing power consumption of the flexible display panel 1.

For example, the cathode signal line 130 provides a cathode signal of −3 volt (−3 V) for the cathode layer 112.

Figure 5A:
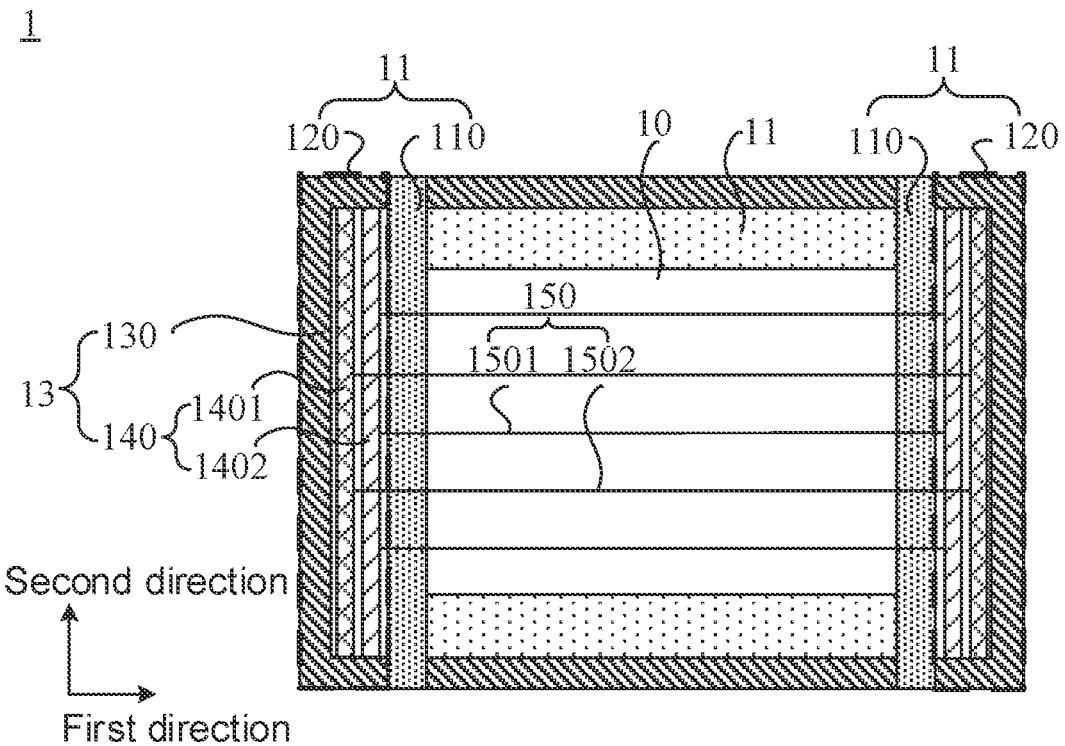
FIG. 5A is a diagram showing a structure of yet another flexible display panel, in accordance with some embodiments of the present disclosure.

In some embodiments, as shown in FIG. 5A, the plurality of signal lines 150 include a plurality of gate lines 1501 and a plurality of light-emitting control signal lines 1502.

The circuit group 140 includes a first gate driving circuit 1401 and a second gate driving circuit 1402 arranged side by side in the first direction. The first gate driving circuit 1401 is configured to connect the plurality of gate lines 1501, and the second gate driving circuit 1402 is configured to connect the plurality of light-emitting control signal lines 1502. The first direction is an extending direction of the gate lines 1501, and is also the length direction of the flexible display panel 1. A second direction is perpendicular to the first direction, that is, the second direction is an arrangement direction of the gate lines, which is also a width direction of the flexible display panel 1.

The first gate driving circuit 1401 is, for example, used to provide gate driving signals Gate for the plurality of gate lines 1501. The second gate driving circuit 1402 is, for example, used to provide light-emitting control signals EM for the plurality of light-emitting control signal lines 1502, and the light-emitting control signals EM belong to another type of the scanning signals.

Figure 5B:
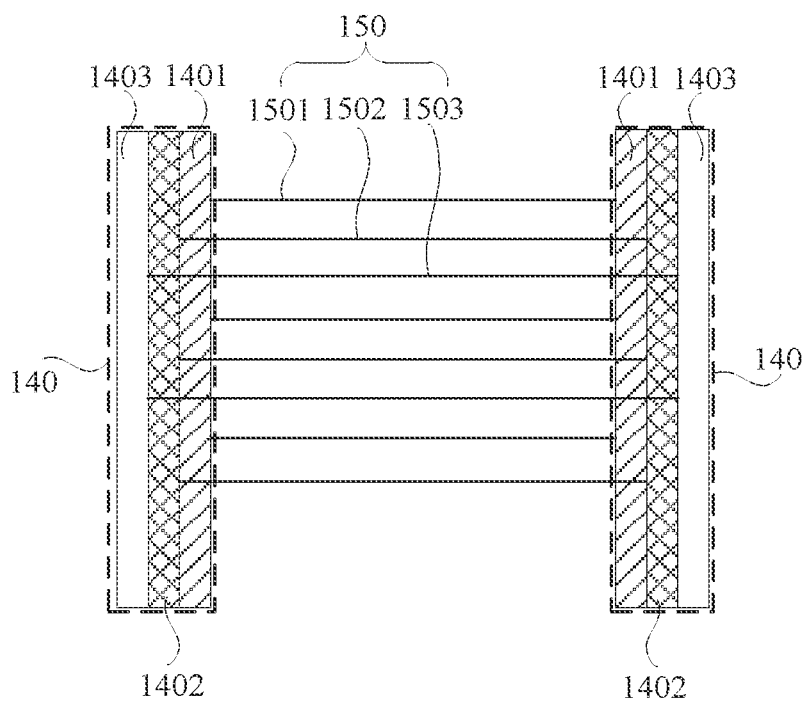
FIGS. 5B and 5C are diagrams showing connection relationships between a circuit group and signal lines, in accordance with some embodiments of the present disclosure.

In some other embodiments, referring to FIG. 5B, the plurality of signal lines 150 further includes a plurality of first reset signal lines 1503, and the circuit group 140 further includes a third gate driving circuit 1403. The third gate driving circuit 1403, the first gate driving circuit 1401 and the second gate driving circuit 1402 are arranged side by side in the first direction. The third gate driving circuit 1403 is configured to be connected to the plurality of first reset signal lines 1503. The third gate driving circuit 1403 is, for example, used to provide a first reset signal Rst1 for the plurality of first reset signal lines 1503, and the first reset signal Rst1 belongs to yet another type of the scanning signals.

Figure 5C:
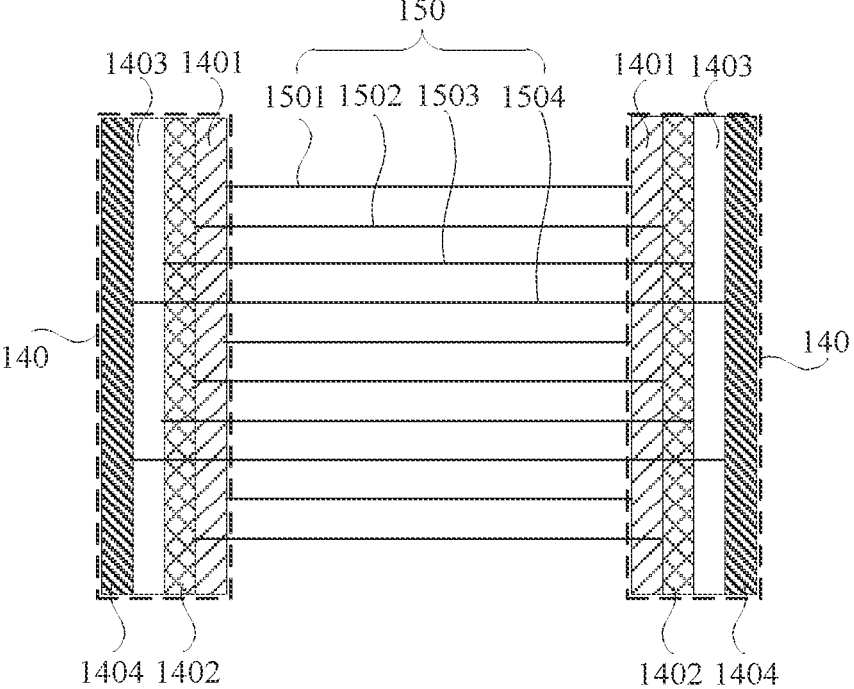

In some other embodiments, referring to FIG. 5C, the plurality of signal lines 150 further includes a plurality of second reset signal lines 1504, and the circuit group 140 further includes a fourth gate driving circuit 1404. The fourth gate driving circuit 1404, the first gate driving circuit 1401 and the second gate driving circuit 1402 are arranged side by side in the first direction. The fourth gate driving circuit 1404 is configured to be connected to the plurality of second reset signal lines 1504. The fourth gate driving circuit 1404 is, for example, used to provide a second reset signal Rst2 for the plurality of second reset signal lines 1504, and the second reset signal Rst2 belongs to yet another type of the scanning signals.

The second gate driving circuit 1402, the third gate driving circuit 1403 and the fourth gate driving circuit 1404 each include a plurality of shift registers connected in cascade. As for a manner of connecting the plurality of shift registers in cascade, reference may be made to the structure of the plurality of shift registers 1401' connected in cascade in the first gate driving circuit 1401.

Referring to FIG. 5C, in a case where the circuit group 140 includes the first gate driving circuit 1401, the second gate driving circuit 1402, the third gate driving circuit 1403 and the fourth gate driving circuit 1404, the four gate driving circuits are arranged side by side in the extending direction of the gate lines 1501.

The pixel driving circuits in the same row of sub-pixels are all electrically connected to a gate line 1501, a light-emitting control signal line 1502, a first reset signal line 1503 and a second reset signal line 1504. The gate line 1501 is used to provide a gate driving signal Gate for the pixel driving circuits 2, the light-emitting control signal line 1502 is used to provide a light-emitting control signal EM for the pixel driving circuits 2, the first reset signal line 1503 is used to provide the first reset signal Rst1 for the pixel driving circuits 2, and the second reset signal line 1504 is used to provide the second reset signal Rst2 for the pixel driving circuits 2.

Figure 6:
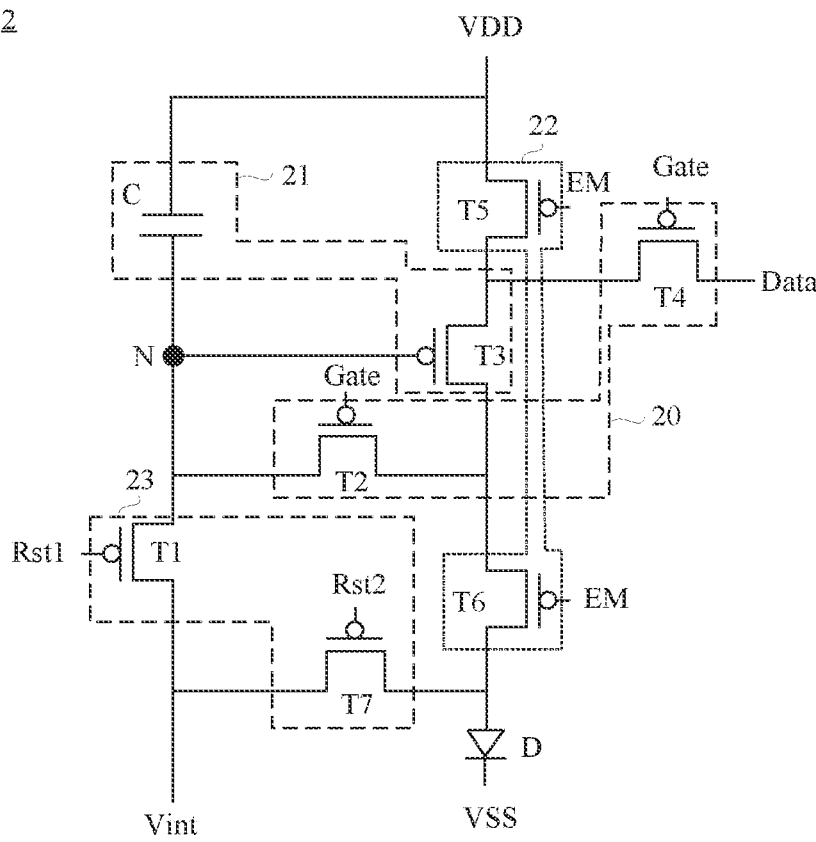
FIG. 6 is a diagram showing a structure of a pixel driving circuit, in accordance with some embodiments of the present disclosure.

Therefore, some embodiments of the present disclosure provide a pixel driving circuit that may receive the gate driving signal Gate, the light-emitting control signal EM, the first reset signal Rst1 and the second reset signal Rst2. Referring to FIG. 6, the pixel driving circuit 2 includes a data writing sub-circuit 20, a driving sub-circuit 21, a light-emitting control sub-circuit 22 and a reset sub-circuit 23.

The data writing sub-circuit 20 is electrically connected to a gate driving signal terminal Gate, a data signal terminal Data, the driving sub-circuit 21 and a node N. The data writing sub-circuit 20 is configured to write a data signal provided by the data signal terminal Data into the node N under control of the gate driving signal terminal Gate.

The driving sub-circuit 21 is electrically connected to the node N, a supply voltage signal terminal VDD, the light-emitting control sub-circuit 22 and a light-emitting device D. The driving sub-circuit 21 is configured to output a driving signal to the light-emitting device D under control of the node N, the supply voltage signal terminal VDD and the light-emitting control sub-circuit 22, so that the light-emitting device D emits light.

The light-emitting control sub-circuit 22 is electrically connected to the supply voltage signal terminal VDD and a light-emitting control signal terminal EM. The light-emitting control sub-circuit 22 is configured to, under control of the light-emitting control signal terminal EM, produce an electrical connection between the driving sub-circuit 21 and an anode of the light-emitting device D.

The reset sub-circuit 23 is electrically connected to the node N, a first reset signal terminal Rst1, a second reset signal terminal Rst2, the anode of the light-emitting device D and an initial signal terminal Vint. The reset sub-circuit 23 is configured to transmit an initial signal provided by the initial signal terminal Vint to the node N under control of the first reset signal terminal Rst1, so as to reset the node N, and transmit the initial signal provided by the initial signal terminal Vint to the anode of the light-emitting device D under control of the second reset signal terminal Rst2, so as to reset the anode of the light-emitting device D.

Referring to FIG. 6, the pixel driving circuit 2 is, for example, a 7T1C pixel driving circuit 2. The data writing sub-circuit 20 includes a second transistor T2 and a fourth transistor T4. A gate of the second transistor T2 is electrically connected to the gate driving signal terminal Gate, a first electrode of the second transistor T2 is electrically connected to the driving sub-circuit 21, and a second electrode of the second transistor T2 is electrically connected to the node N. A gate of the fourth transistor T4 is electrically connected to the gate driving signal terminal Gate, a first electrode of the fourth transistor T4 is electrically connected to the data signal terminal Data, and a second electrode of the fourth transistor T4 is electrically connected to the driving sub-circuit 21.

The driving sub-circuit 21 includes a third transistor T3 and a capacitor C. A gate of the third transistor T3 is electrically connected to the node N, a first electrode of the third transistor T3 is electrically connected to the light-emitting control sub-circuit 22, and a second electrode of the third transistor T3 is electrically connected to the anode of the light-emitting device D through the light-emitting control sub-circuit 22. The third transistor T3 is a driving transistor. A terminal of the capacitor C is electrically connected to the supply voltage signal terminal VDD, and the other terminal of the capacitor C is electrically connected to the node N.

The light-emitting control sub-circuit 22 includes a fifth transistor T5 and a sixth transistor T6. A gate of the fifth transistor T5 is electrically connected to the light-emitting control signal terminal EM, a first electrode of the fifth transistor T5 is electrically connected to the supply voltage signal terminal VDD, and a second electrode of the fifth transistor T5 is electrically connected to the first electrode of the third transistor T3. A gate of the sixth transistor T6 is electrically connected to the light-emitting control signal terminal EM, a first electrode of the sixth transistor T6 is electrically connected to the second electrode of the third transistor T3, and a second electrode of the sixth transistor T6 is electrically connected to the anode of the light-emitting device D.

The reset sub-circuit 23 includes a first transistor T1 and a seventh transistor T7. A gate of the first transistor T1 is electrically connected to the first reset signal terminal Rst1, a first electrode of the first transistor T1 is electrically connected to the initial signal terminal Vint, and a second electrode of the first transistor T1 is electrically connected to the node N. A gate of the seventh transistor T7 is electrically connected to the second reset signal terminal Rst2, a first electrode of the seventh transistor T7 is electrically connected to the initial signal terminal Vint, and a second electrode of the seventh transistor T7 is electrically connected to the anode of the light-emitting device D.

A cathode of the light-emitting device D is electrically connected to a first voltage terminal VSS, that is, the first voltage terminal VSS is electrically connected to the cathode layer 112 in the flexible display panel 1, and the cathode layer 112 is electrically connected to the cathode signal line 130. That is, without considering attenuation of an electrical signal, a magnitude of an electrical signal received by the cathode of the light-emitting device D is equal to a magnitude of the electrical signal provided by the cathode signal line 130.

An operating process of the pixel driving circuit 2 is as follows.

In a reset period, under the control of the first reset signal terminal Rst1 and the second reset signal terminal Rst2, the first transistor T1 and the seventh transistor T7 are turned onto transmit the initial signal provided by the initial signal terminal Vint to the node N and the anode of the light-emitting device D, so as to reset the node N and the anode of the light-emitting device D.

In the data writing period, under the control of the gate driving signal terminal Gate, the fourth transistor T4 and the second transistor T2 are turned on to write a sum of the data signal provided by the data signal terminal Data and a threshold voltage of the third transistor T3 into the node N, so as to charge the capacitor C.

In a light-emitting period, under the control of the light-emitting control signal terminal EM, the fifth transistor T5 and the sixth transistor T6 are turned on. The capacitor C starts to discharge. Under the control of the node N, the third transistor T3 is turned on. Under control of a voltage of the gate of the third transistor T3 and the supply voltage signal provided by the supply voltage signal terminal VDD, the third transistor T3 outputs the driving signal to the light-emitting device D, the driving signal is, for example, a current signal, so as to drive the light-emitting device D to emit light.

Those skilled in the art may understand that a magnitude of the driving signal is related to a magnitude of the voltage of the gate of the third transistor T3 and a magnitude of a voltage of a source of the third transistor T3. In some embodiments of the present disclosure, when the fifth transistor T5 is turned on, signal received by the source of the third transistor T3 is the supply voltage signal. Therefore, the third transistor T3 outputs the driving signal under the control of the voltage of the gate thereof and the supply voltage signal.

For example, a first electrode of any one of the first transistor T1 to the seventh transistor T7 is, for example, a source, and the second electrode is, for example, a drain.

For example, the first transistor T1 to the seventh transistor T7 are, for example, P-type transistors or N-type transistors. A description will be given by taking an example in which the first transistor T1 to the seventh transistor T7 are P-type transistors in some embodiments of the present disclosure.

It will be noted that, in some embodiments of the present disclosure, VDD, EM, Gate, Data, Rst1, Rst2, Vint, and VSS may represent corresponding signal terminals, and may further represent signals provided by the signal terminals. For example, Gate represents the gate driving signal terminal Gate, and further represents the gate driving signal provided by the gate driving signal terminal Gate.

In some embodiments, referring to FIGS. 2A to 2C, the cathode signal line 130 is arranged around the display area 10.

Referring to FIG. 2C, although portions of the cathode signal line 130 located on three sides of the display area 10 are not connected together, the cathode signal line 130 may also be regarded as being arranged around the display area 10. Moreover, in this structure, respective portions of the cathode signal line 130 are not connected together in order to facilitate bending the portion of the flexible display panel 1 located in the bendable region 110.

In some other embodiments, referring to FIG. 2D, the display area 10 has a rectangular shape, and the cathode signal line 130 is arranged around three sides of the display area 10.

The cathode signal line 130 may be arranged according to the specific structure of the flexible display panel 1 to adapt the flexible display panel 1 with a different size.

In some embodiments, a width of the bendable region 110 is in a range of 1.0 mm to 1.5 mm, inclusive; and a width of the cathode signal line 130 is in a range of 2.0 mm to 3.5 mm, inclusive.

For example, the width of the bendable region 110 is 1340 μm.

When the portion of the flexible display panel 1 located in the bendable region 110 is bent along a center line of the bendable region 110, half of the width of the bendable region 110 may be referred to as a bendable radius. For example, the bendable radius is equal to 600 μm.

In some embodiments, a distance between a side of the display area 10 proximate to the bendable region 110 and the center line of the bendable region 110 is, for example, 500 μm. In this structure, the bendable radius of the bendable region 110 is less than or equal to 500 μm, so that an edge of the display region may be prevented from warping.

In some embodiments, widths of portions of the cathode signal line 130 located on different sides of the display area 10 are different. For example, widths of portions of the cathode signal line 130 that are located on opposite sides of the display area 10 and arranged in the first direction are the same. Widths of portions of the cathode signal line 130 that are located on another opposite sides of the display area 10 and arranged in the second direction are different, and are both greater than the widths of the portions of the cathode signal line 130 arranged in the first direction.

For example, referring to FIG. 2E, widths of portions of the cathode signal line 130 located on a left side and a right side of the flexible display panel 1 are the same. Widths of portions of the cathode signal line 130 located on an upper side and a lower side of the flexible display panel 1 are different, and are both less than the widths of the portions of the cathode signal line 130 located on the left side and the right side of the flexible display panel 1. For example, the width of the portion of the cathode signal line 130 located on the upper side of the flexible display panel 1 is greater than the width of the portion of the cathode signal line 130 located on the lower side of the flexible display panel 1, and the width of the portion of the cathode signal line 130 located on the upper side of the flexible display panel 1 is less than the widths of the portions of the cathode signal line 130 located on the left side and the right side of the flexible display panel 1.

Since the width of the cathode signal line 130 is set as large as possible, widths of portions of the cathode signal line 130 disposed at different positions may be specifically set according to the positions of the cathode signal line 130, so as to reasonably utilize the peripheral area 11 of the flexible display panel 1.

Figure 7A:
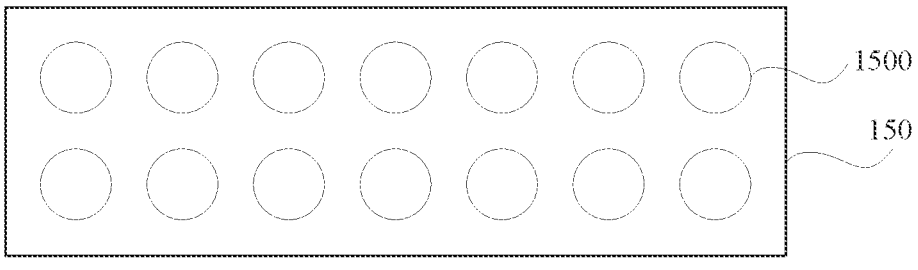
FIGS. 7A to 7D are each a diagram showing a structure of a portion of at least one signal line located in a bendable region, in accordance with some embodiments of the present disclosure.

In some embodiments, referring to FIG. 7A, of the plurality of signal lines 150, a portion of at least one signal line 150 located in the bendable region 110 includes a plurality of holes 1500 arranged at intervals. The holes 1500 may be through holes or blind holes. A material of the signal line 150 is, for example, metal such as silver (Ag) or aluminum (Al).

The signal line 150 located in the bendable region 110 needs to be bent. Although the signal line 150 made of the metal material has a certain ductility, in order to prevent the signal line 150 from being broken due to stress during bending and then affecting signal transmission of the signal line 150, the plurality of holes 1500 are disposed in the signal line 150 to release the stress of the signal line 150 during bending.

Figure 7B:
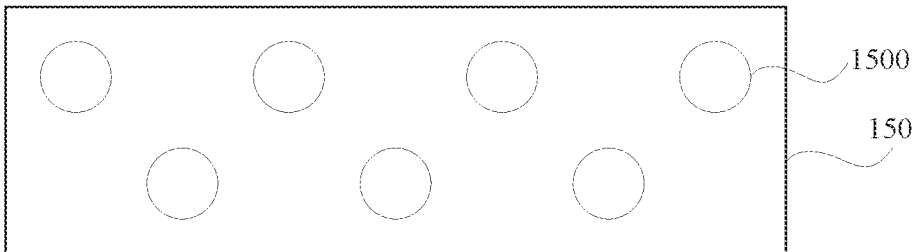

In some embodiments, referring to FIG. 7B, the plurality of holes 1500 includes at least two rows of holes 1500 arranged in the first direction, and orthogonal projections of any two holes 1500 located in different rows on the flexible substrate are non-overlapping. Since the orthogonal projections of any two holes 1500 located in the different rows on the flexible substrate are non-overlapping, a stress that occurs in the signal line 150 when bent may be relieved: moreover, upper and lower rows of holes 1500 are staggered in a width direction of the signal line 150 (the second direction), which may ensure strength of the signal line 150 in the width direction thereof and may avoid a crack that occurs in the signal line 150 when bent.

Figure 7C:
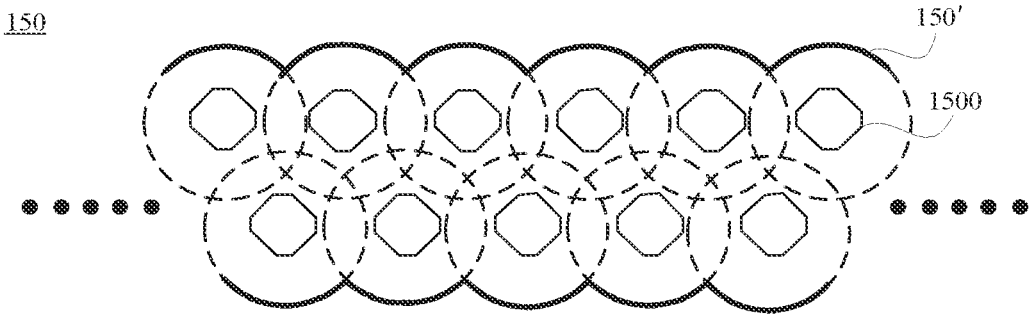
Figure 7D:
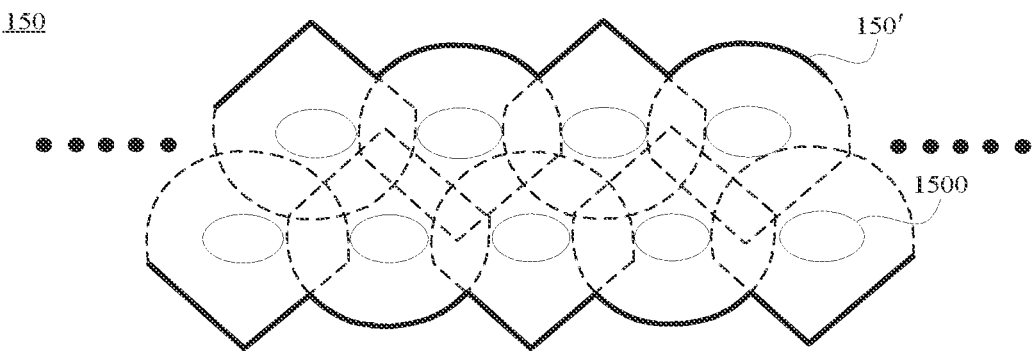

In some embodiments, referring to FIGS. 7C and 7D, an outer contour of a portion of at least one signal line 150 located in the bendable region 110 includes connected arcs and/or broken lines.

Referring to FIG. 7C, the outer contour 150' of the portion of the signal line 150 located in the bendable region 110 includes a plurality of arcs that are connected, and this portion of the signal line 150 may be regarded as a portion formed by overlapping a plurality of circular patterns. Each circular pattern is provided therein with a hole 1500 in a shape of a rounded rectangle, and orthogonal projections of holes 1500 located in different rows on the flexible substrate are non-overlapping.

Referring to FIG. 7D, the outer contour 150' of the portion of the signal line 150 located in the bendable region 110 includes a plurality of arcs and broken lines that are connected, and the arcs and the broken lines are arranged at intervals. This portion of the signal line 150 may be regarded as a portion formed by overlapping a plurality of patterns in a shape like a water drop. Each pattern in the shape of the water drop is provided therein with an oval hole 1500, and orthogonal projections of holes 1500 in different rows on the flexible substrate are non-overlapping.

The structures of the portions of the above two signal lines 150 located in the bendable region 110 are special. Through simulation mechanical experiments, when the signal lines 150 with these structures are bent, a stress release effect is good, and a probability of a crack occurring in the signal lines 150 is low.

In some embodiments, referring to FIGS. 8A to 8D, the flexible display panel 1 further includes a plurality of insulating layers 114 disposed on the flexible substrate 16. A material of the insulating layer 114 is an inorganic material. Of the plurality of insulating layers 114, at least one insulating layer 114 is provided therein with at least one groove 1140 located in the bendable region 110, and the at least one groove 1140 is filled with an organic material 1140'.

Figure 8A:
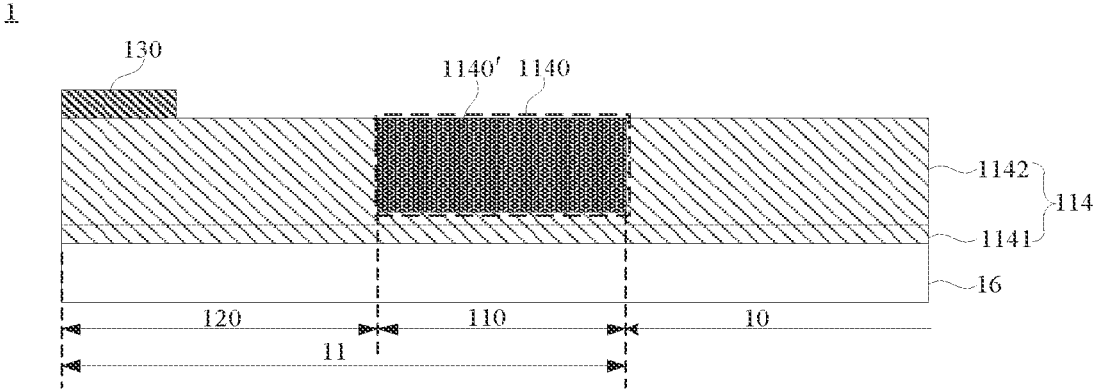
FIGS. 8A to 8D are each a diagram showing a structure of yet another flexible display panel, in accordance with some embodiments of the present disclosure.
Figure 8B:
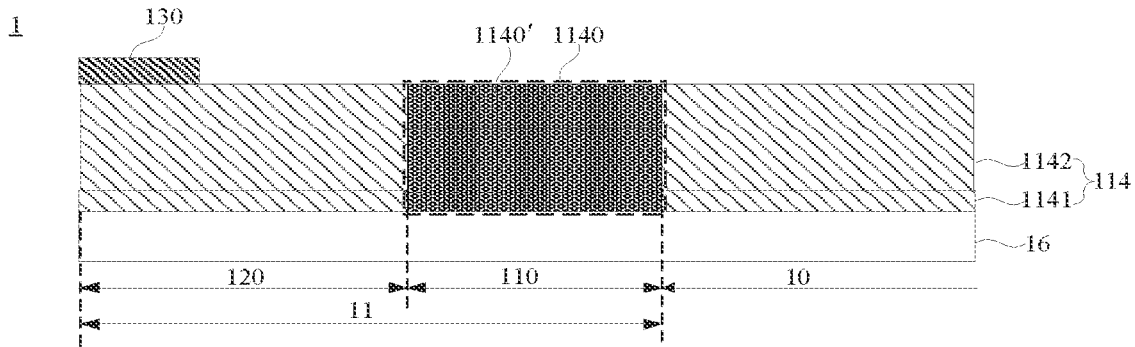

Referring to FIGS. 8A and 8B, a thickness of the groove 1140 is less than or equal to a thickness of the insulating layer 114.

The insulating layers 114 are disposed between the cathode signal line 130 and the flexible substrate 16, and the inorganic material 114 for forming the insulating layers is, for example, at least one of silicon oxide and silicon nitride. The organic material 1140' filled in the groove 1140 is, for example, at least one of polyimide and over coat (OC, photosensitive protective material).

Since the organic material has a certain ductility, and the inorganic material do not have the ductility, there is a need to form the groove 1140 in a portion of the insulating layers 114 corresponding to the bendable region 110, and then fill the groove 1140 with the organic material 1140'. In this way, the portion of the insulating layers 114 located in the bendable region 110 may be bent.

For example, referring to FIG, 8A, two insulating layers 114 are disposed on the flexible substrate 16. One of the two insulating layers is a first insulating layer 1141, and the other of the two insulating layers is a second insulating layer 1142. A thickness of the second insulating layer 1142 is greater than a thickness of the first insulating layer 1141. A groove 1140 is disposed in a region of the second insulating layer 1142 with a larger thickness corresponding to the bendable region 110, and the groove 1140 does not penetrate the second insulating layer 1142 and is filled with the organic material 1140'.

It will be noted that although the groove 1140 does not penetrate the second insulating layer 1142 and the first insulating layer 1141 is not provided with the groove 1140 therein, a thickness of an entire insulating layer 114 under the groove 1140 (including the first insulating layer 1141 and a portion of the second insulating layer 1142 under the groove 1140) is relatively thin, and the bendable region 110 may still be bent.

For example, the thickness of the first insulating layer 1141 is in a range of 10 Å to 50 Å (angstroms), inclusive; and the first insulating layer 1141 is a buffer layer.

For another example, referring to FIG. 8B, two insulating layers 114 are disposed on the flexible substrate 16. A groove 1140 is disposed in a region, corresponding to the bendable region 110, of the first insulating layer 1141 and the second insulating layer 1142, and the groove 1140 penetrates the first insulating layer 1141 and the second insulating layer 114 and is filled with the organic material 1140'.

In a case where the bendable region 110 includes the single groove 1140, the groove 1140 may be filled with a large amount of the organic material 1140'. The portion of the flexible display panel 1 located in the bendable region 110 has a good ductility, which facilitates to fold the portion of the flexible display panel 1 located in the foldable region 120, and the groove 1140 is formed easily.

Figure 8C:
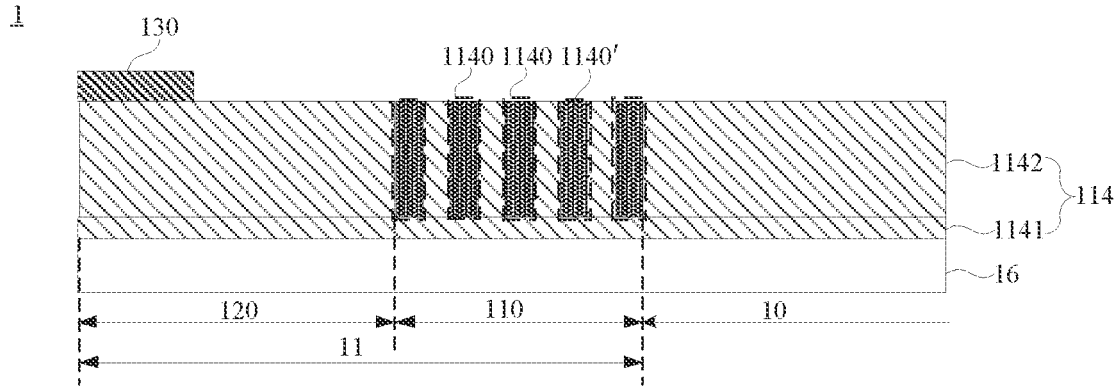

In some other embodiments, as shown in FIG. 8C, there are a plurality of grooves 1140. The plurality of grooves 1140 extend in the thickness direction of the flexible substrate 16 and are distributed in a direction perpendicular to the thickness direction of the flexible substrate 16, and orthogonal projections of the plurality of grooves 1140 on the flexible substrate 16 are non-overlapping. The direction perpendicular to the thickness direction of the flexible substrate 16 is a longitudinal direction of the flexible substrate 16.

For example, referring to FIG. 8C, the insulating layers 114 are provided with a plurality of grooves 1140 arranged at intervals therein. Each groove 1140 only penetrates the second insulating layer 1142, the plurality of grooves 1140 are located in the bendable region 110, and each groove 1140 is filled with the organic material 1140'. For another example, each groove 1140 penetrates the first insulating layer 1141 and the second insulating layer 1142, the plurality of grooves 1140 are located in the bendable region 110, and each groove 1140 is filled with the organic material 1140'.

In a case where the plurality of grooves 1140 are distributed at intervals, the portion of the flexible display panel 1 located in the bendable region 110 still has a certain ductility. Therefore, the portion of the flexible display panel 1 located in the bendable region 110 may also be bent, and it may be ensured that strength of the portion of the flexible display panel 1 located in the bendable region 110 is high.

Figure 8D:
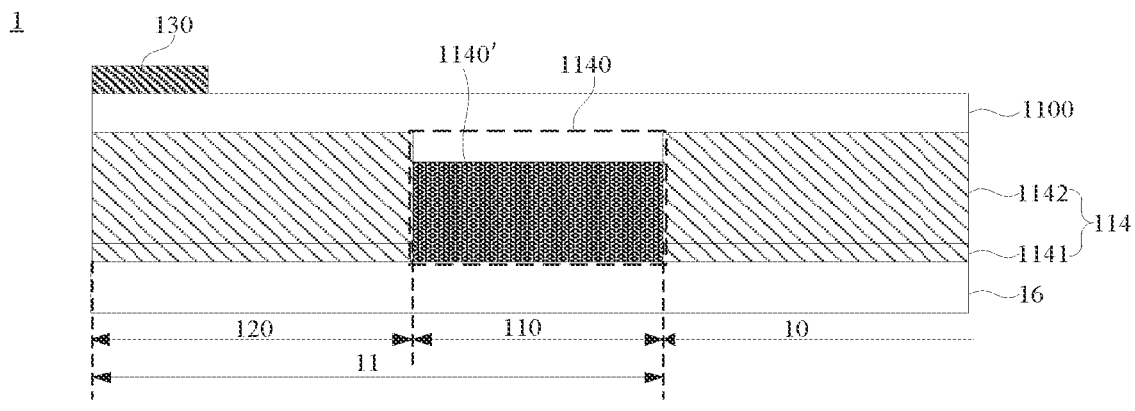

In some embodiments, referring to FIG. 8D, the flexible display panel 1 further includes at least one planarization layer 1100 disposed on a side of the insulating layers 114 away from the flexible substrate 16, and the at least one planarization layer 1100 covers the groove 1140.

Since a portion of the planarization layer 1100 is filled in the groove 1140, materials in the groove 1140 include the organic material 1140' and a material of the planarization layer 1100. In some embodiments, the organic material 1140' in the groove 1140 that is located on a side of the planarization layer 1100 proximate to the flexible substrate 16 is polyimide, and the material of the planarization layer 1100 is the OC material. Therefore, the two organic materials are filled in the groove 1140.

The at least one planarization layer 1100 covers the groove 1140, and a situation that a side of the groove 1140 away from the flexible substrate 16 is not filled when the organic material 1140' is filled in the groove 1140 may be avoided.

Figure 9A:
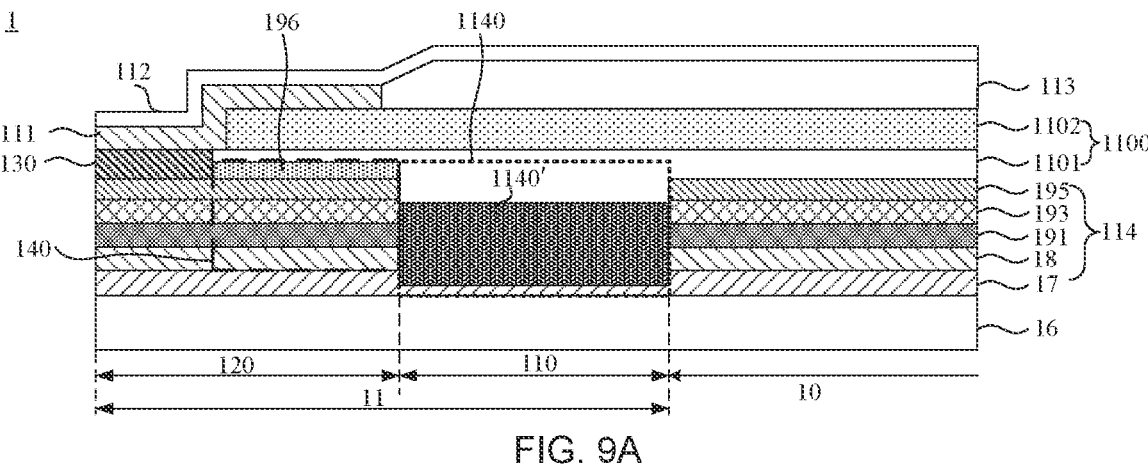
FIG. 9A is a diagram showing a structure of yet another flexible display panel, in accordance with some embodiments of the present disclosure.

In some embodiments, referring to FIG. 9A, in the thickness direction of the flexible substrate 16, the flexible display panel 1 includes a barrier layer 17, a buffer layer 18, a first gate insulating layer 191, a second gate insulating layer 193 and an interlayer insulating layer 195 that are stacked in sequence, and these layers belong to the insulating layers 114.

The barrier layer 17, the buffer layer 18, the first gate insulating layer 191, the second gate insulating layer 193 and the interlayer insulating layer 195 cover the display area 10 and the peripheral area 11.

A portion of first gate insulating layer 191, a portion of the second gate insulating layer 193 and a portion of the interlayer insulating layer 195 are layers of a thin film transistor, and the thin film transistor is disposed on buffer layer 18.

Figure 9B:
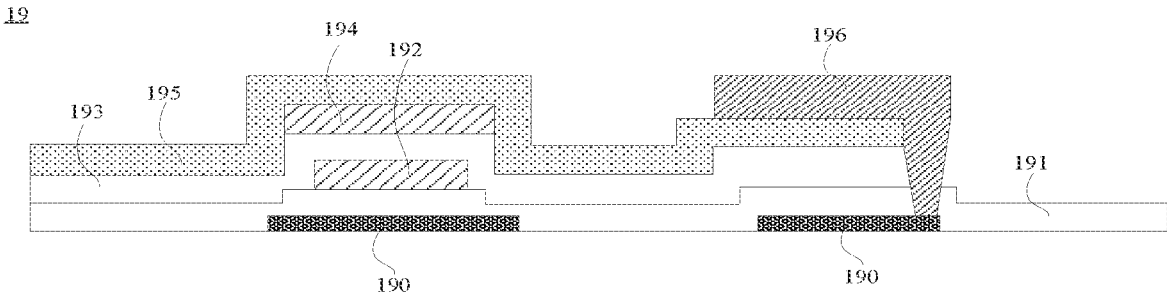
FIG. 9B is a diagram showing a structure of a thin film transistor, in accordance with some embodiments of the present disclosure.

For example, referring to FIG. 9B, some embodiments of the present disclosure provide the thin film transistor 19. In the thickness direction of the flexible substrate 16, the thin film transistor 19 includes an active layer 190, a portion of the first gate insulating layer 191, a gate 192, a portion of the second gate insulating layer 193, a conductive layer 194, a portion of the interlayer insulating layer 195, and a source and drain 196 (SD layer). The source and drain 196 are in contact with the active layer 190. A material of the active layer 190 may be, for example, one of amorphous silicon (a-si), polycrystalline silicon (p-si), an organic semiconductor, an oxide semiconductor material and the like. The oxide semiconductor material may be, for example, one of indium gallium zinc oxide (IGZO) and indium neodymium oxide (InNdO). The barrier layer 17 and the buffer layer 18 are used to isolate hydrogen (H) particles and oxygen (O) particles in the flexible substrate 16 from affecting the active layer 190 of the thin film transistor 19.

For example, a thickness of the barrier layer 17 is, for example, 5500 Å.

For example, referring to FIG. 9A, the groove 1140 does not penetrate all the insulating layers 114. For example, a portion of the barrier layer 17 is etched away to form a portion of the groove 1140, and a thickness of a remaining portion of the barrier layer 17 is, for example, 2000 Å. The remaining portion of the barrier layer 17 in the bendable region 110 may prevent the groove 1140 from damaging the flexible substrate 16 due to improper operation process.

For example, referring to FIG. 9B, a material of the gate 192 and the conductive layer 194 is conductive metal, such as aluminum.

The material of the source and drain 196 is, for example, a conductive metal material, and the conductive metal material is, for example, silver, aluminum or copper (Cu).

It will be noted that the two portions of the active layer 190 in FIG. 9B are actually connected together, and FIG. 98 shows a structure of the single thin film transistor 19.

The thin film transistor 19 in the pixel driving circuit 2 located in the display area 10 and thin film transistors 19 in the first gate driving circuit 1401, the second gate driving circuit 1402, the third gate driving circuit 1403 and the fourth gate driving circuit 1404 in the circuit group 140 that are located in the foldable region 120 are formed simultaneously.

Referring to FIG. 9A, a first planarization layer 1101, a second planarization layer 1102 and a pixel defining layer 113 are stacked on the interlayer insulating layer 195. The first planarization layer 1101 and the second planarization layer 1102 cover the display region 10, the bendable region 110 and a portion of the foldable region 120. The pixel defining layer 113 includes a plurality of hollow regions (not shown in FIG. 9A) each filled with a light-emitting material The material of the first planarization layer 1101 and the second planarization layer 1102 is, for example, an organic material, and the organic material is, for example, the OC material.

A material of the pixel defining layer 113 is, for example, an organic material, and the organic material is, for example, the photosensitive polyimide.

In the foldable region 120, the cathode signal line 130 is disposed on the interlayer insulating layer 195, an anode layer 111 is disposed on the cathode signal line 130, the anode layer 111 includes a plurality of anode patterns, and a cathode layer 112 is disposed on the anode layer 111. The cathode signal line 130 is electrically connected to the cathode layer 112 through the anode patterns (not as the anode in the OLED) in the anode layer 111.

A material of the anode layer 111 is indium tin oxide (ITO), and a material of the cathode layer 112 is, for example, conductive metal such as silver.

When the cathode signal line 130 is formed, the cathode signal line 130 may be disposed in a same layer and made of a same material as the gate 192 or the conductive layer 194 in the thin film transistor 19, or may be disposed in a same layer and made of a same material as the source and drain 196. FIG. 9A shows a structure that the cathode signal line 130 is disposed in the same layer and made of the same material as the source and drain 196.

It will be noted that the materials of the first planarization layer 1101, the second planarization layer 1102 and the pixel defining layer 113 are organic materials, and the first planarization layer 1101, the second planarization layer 1102 and the pixel defining layer 113 all have ductility; and the material of the cathode layer 112 is silver, and silver also has the ductility. Therefore, there is no need to provide the groove 1140 in the first planarization layer 1101, the second planarization layer 1102, the pixel defining layer 113 and the cathode layer.

The insulating layers 114 such as the barrier layer 17, the buffer layer 18, the first gate insulating layer 191, the second gate insulating layer 193 and the interlayer insulating layer 195 are generally made of silicon oxide, silicon nitride, or the like, and these insulating layers 114 do not have the ductility. Therefore, there is a need to remove a portion of these insulating layers 114 located in the bendable region 110 to form the groove 1140, and then fill the groove 1140 with the organic material 1140', so that the portion of the flexible display panel 1 located in the bendable region 110 may be bent.

Figure 10:
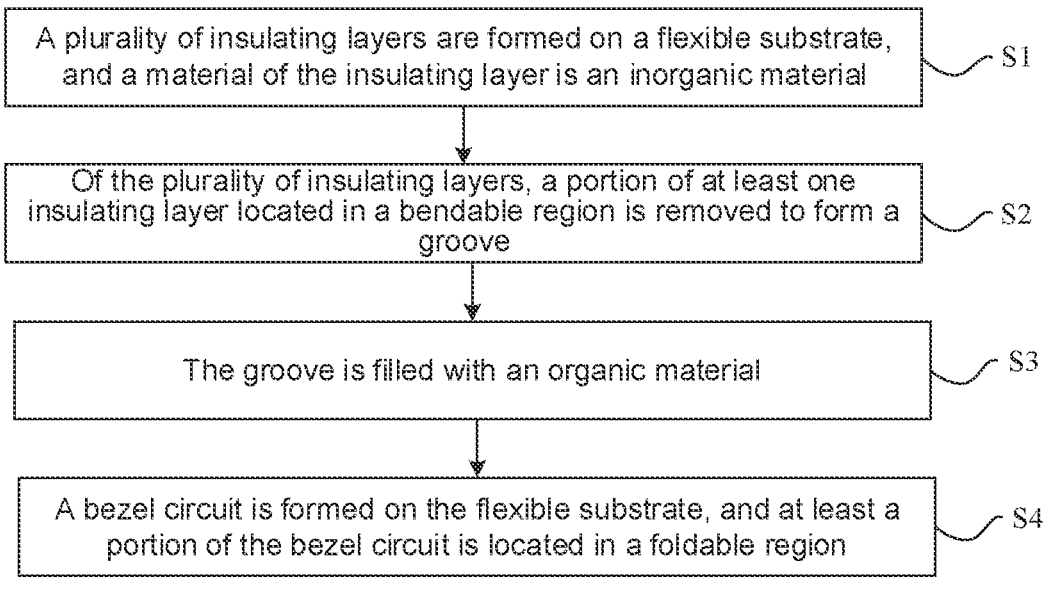
FIG. 10 is a flowchart of a method for manufacturing a flexible display panel, in accordance with some embodiments of the present disclosure.

Referring to FIG. 10, the present disclosure further provide a method for manufacturing a flexible display panel 1, which includes the following steps.

Figure 11A:
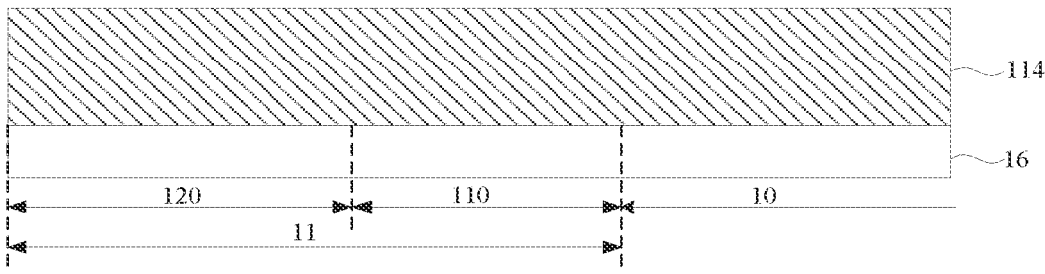
FIGS. 11A to 11D are diagrams showing a manufacturing process of a flexible display panel, in accordance with some embodiments of the present disclosure.

In step S1, referring to FIG. 11A, a plurality of insulating layers 114 are formed on a flexible substrate 16, and a material of the insulating layer 114 is an inorganic material.

For example, a material of the insulating layer 114 is one of silicon oxide and silicon nitride.

For example, the insulating layers 114 are formed by magnetron sputtering.

Figure 11B:
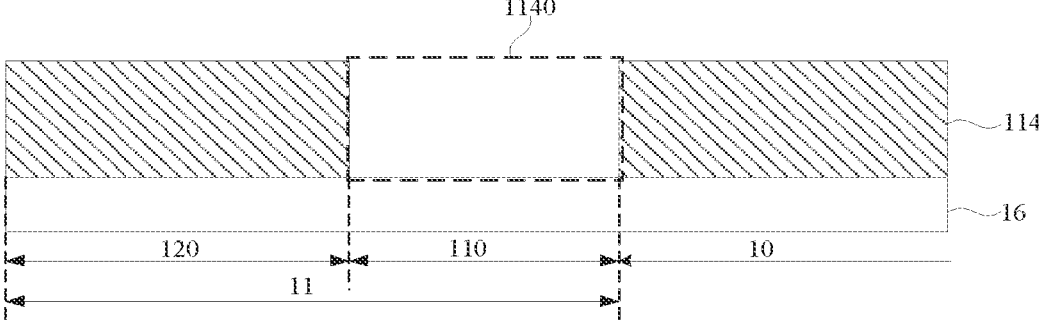
Figure 11C:
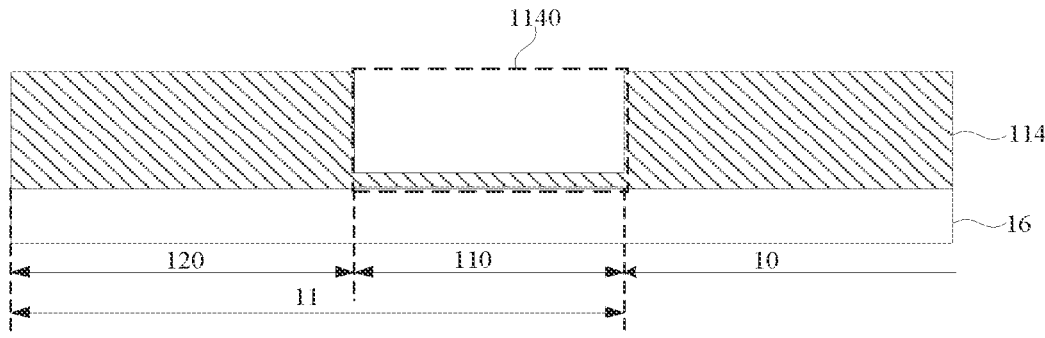

In step S2, referring to FIGS. 11B and 11C, of the plurality of insulating layers 114, a portion of at least one insulating layer 114 located in a bendable region 110 is removed to form a groove 1140.

The groove 1140 is formed in the insulating layer 114 through a mask and a patterning process. The patterning process includes processes such as form a photoresist by a coating process, exposure, development and etching.

Figure 11D:
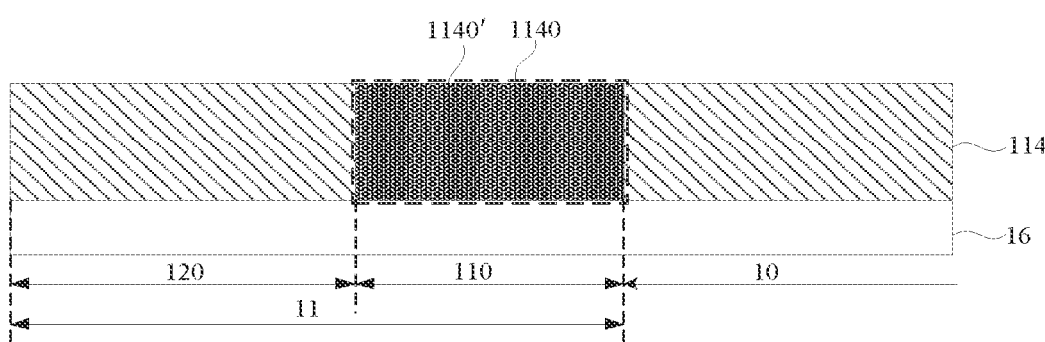

In S3, referring to FIG. 11D, the groove 1140 is filled with an organic material 1140'.

For example, the groove 1140 is filled with polyimide.

In S4, referring to FIG. 8A, a bezel circuit 13 is formed above the flexible substrate 16, and at least a portion of the bezel circuit 13 is located in a foldable region 120.

For example, forming the bezel circuit 13 above the flexible substrate 16 includes forming a cathode signal line 130 above the flexible substrate 16, and at least a portion of the cathode signal line 130 is located in the folded region 120.

For example, the cathode signal line 130 is disposed in a same layer and made of a same material as the conductive layer 194 in the thin film transistor 19 described above.

In the method for manufacturing the flexible display panel 1 provided by the present disclosure, the groove 1140 is formed in the insulating layer 114, and the organic material 1140' having ductility is filled in the groove 1140, As a result, the portion of the flexible display panel 1 located in the bendable region 110 may be bent, and then the portion of the flexible display panel 1 located in the foldable region 120 is folded to a non-display side of the flexible display panel 1, thereby reducing a frame width of the flexible display panel 1.

In some embodiments, referring to FIGS. 40 and 4D, forming the bezel circuit 13 above the flexible substrate 16 further includes forming a plurality of signal lines 150 and at least one circuit group 140 above the flexible substrate 16. A circuit group 140 includes at least one gate driving circuit located in the foldable region 120. The at least one gate driving circuit is configured to connect the plurality of signal lines 150, and the plurality of signal lines 150 are formed in synchronization with the gate 192 or the conductive layer 194 of the thin film transistor 19 in the gate driving circuit.

The plurality of signal lines 150 may be formed in synchronization with the gate 192 in the thin film transistor 19, or may be formed in synchronization with the conductive layer 194. For example, the conductive layer 194 is configured to form a capacitor, a connection electrode, and the like in the gate driving circuit.

In some other embodiments, the plurality of signal lines 150 are formed in synchronization with the source and the drain 196 of the thin film transistor 19 in the gate driving circuit.

In some embodiments, referring to FIGS. 4A and 4C, forming the cathode signal line 130 above the flexible substrate 16 includes forming the cathode signal line 130 on a side of the circuit group 140 away from a display area 10. An area of the formed cathode signal line 130 may be large, which is beneficial to reduce impedance between the cathode signal line 130 and the cathode layer 112.

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A flexible display panel, having a display area and a peripheral area located around the display area, wherein the peripheral area includes at least one bendable region and at least one foldable region located on a side of the at least one bendable region away from the display area, the at least one bendable region and the at least one foldable region are in one-to-one correspondence;

the flexible display panel comprises: a flexible substrate, and a bezel circuit that is disposed on the flexible substrate and located in the peripheral area, and at least a portion of the bezel circuit is located in a foldable region of the at least one foldable region; and a portion of the flexible display panel located in the foldable region is configured to be folded toward a direction away from a display side of the flexible display panel through a portion of the flexible display panel located in a corresponding bendable region of the at least one bendable region;

wherein a width of a bendable region of the at least one bendable region is in a range of 1.0 mm to 1.5 mm, inclusive; and the bezel circuit includes a cathode signal line, and a width of the cathode signal line is in a range of 2.0 mm to 3.5 mm, inclusive.

2. The flexible display panel according to claim 1, further comprising: a plurality of insulating layers disposed on the flexible substrate, wherein a material of each insulating layer is an inorganic material, at least one insulating layer of the plurality of insulating layers includes at least one groove located in a bendable region of the at least one bendable region therein, and the at least one groove is filled with an organic material.

3. The flexible display panel according to claim 1, wherein at least a portion of the cathode signal line is located in the foldable region.

4. The flexible display panel according to claim 3, wherein the cathode signal line is arranged around the display area; or the display area is in a shape of a rectangle and the cathode signal line is arranged around three sides of the display area.

5. The flexible display panel according to claim 1, wherein the bezel circuit includes a plurality of signal lines and at least one circuit group that are disposed on the flexible substrate; a circuit group of the at least one circuit group includes at least one gate driving circuit located in the foldable region, and the at least one gate driving circuit is configured to connect at least some of the plurality of signal lines.

6. The flexible display panel according to claim 5, wherein the circuit group is located on a side of the cathode signal line proximate to the bendable region.

7. The flexible display panel according to claim 5, wherein the at least some of the plurality of signal lines include a plurality of gate lines and a plurality of light-emitting control signal lines; and the circuit group includes a first gate driving circuit and a second gate driving circuit arranged side by side in a first direction, the first gate driving circuit is configured to connect the plurality of gate lines, and the second gate driving circuit is configured to connect the plurality of light-emitting control signal lines; and the first direction is an extending direction of the gate lines.

8. The flexible display panel according to claim 7, wherein the at least some of the plurality of signal lines further include a plurality of first reset signal lines, the circuit group further includes a third gate driving circuit, the third gate driving circuit is arranged side by side with the first gate driving circuit and the second gate driving circuit in the first direction, and the third gate driving circuit is configured to connect the plurality of first reset signal lines; or the at least some of the plurality of signal lines further include a plurality of second reset signal lines, the circuit group further includes a fourth gate driving circuit, the fourth gate driving circuit is arranged side by side with the first gate driving circuit and the second gate driving circuit in the first direction, and the fourth gate driving circuit is configured to connect the plurality of second reset signal lines; or the at least some of the plurality of signal lines further include a plurality of first reset signal lines, the circuit group further includes a third gate driving circuit, the third gate driving circuit is arranged side by side with the first gate driving circuit and the second gate driving circuit in the first direction, and the third gate driving circuit is configured to connect the plurality of first reset signal lines; and the at least some of the plurality of signal lines further include a plurality of second reset signal lines, the circuit group further includes a fourth gate driving circuit, the fourth gate driving circuit is arranged side by side with the first gate driving circuit and the second gate driving circuit in the first direction, and the fourth gate driving circuit is configured to connect the plurality of second reset signal lines.

9. The flexible display panel according to claim 7, wherein of the plurality of signal lines, a portion of at least one signal line located in the bendable region includes a plurality of holes arranged at intervals.

10. The flexible display panel according to claim 9, wherein the plurality of holes include at least two rows of holes arranged in the first direction, and orthogonal projections of any two holes located in different rows on the flexible substrate are non-overlapping.

11. The flexible display panel according to claim 9, wherein an outer contour of the portion of the at least one signal line located in the bendable region includes connected arcs lines; or an outer contour of the portion of the at least one signal line located in the bendable region includes connected fold lines; or an outer contour of the portion of the at least one signal line located in the bendable region includes connected arcs and fold lines.

12. The flexible display panel according to claim 2, wherein the at least one groove includes a plurality of grooves, and the plurality of grooves extend in a thickness direction of the flexible substrate, and distributed in a direction perpendicular to the thickness direction of the flexible substrate, and orthogonal projections of the plurality of grooves on the flexible substrate are non-overlapping.

13. The flexible display panel according to claim 2, further comprising: at least one planarization layer disposed on a side of the insulating layers away from the flexible substrate, the at least one planarization layer covering the groove.

14. A display apparatus, comprising the flexible display panel according to claim 1, the at least one foldable region of the flexible display panel being located on a non-display side of the flexible display panel.

15. A tiled display apparatus, comprising a plurality of flexible display panels according to claim 1, wherein of two adjacent flexible display panels of the plurality of flexible display panels, at least one flexible display panel includes one bendable region and one foldable region on a side thereof proximate to another flexible display panel, and the one foldable region is located on a non-display side of the at least one flexible display panel.

16. A method for manufacturing a flexible display panel, the flexible display panel having a display area and a peripheral area located around the display area, wherein the peripheral area includes at least one bendable region and at least one foldable region located on a side of the at least one bendable region away from the display area, the at least one bendable region and the at least one foldable region are in one-to-one correspondence; and the method for manufacturing the flexible display panel comprises:

forming a plurality of insulating layers on a flexible substrate, a material of each insulating layer being an inorganic material;

removing a portion of at least one insulation layer of the plurality of insulation layers located in a bendable region of the at least one bendable region to form a groove;

filling the at least one groove with an organic material; and forming a bezel circuit on the flexible substrate, at least a portion of the bezel circuit being located in a foldable region of the at least one foldable region; and forming the bezel circuit on the flexible substrate includes:

forming a cathode signal line on the flexible substrate, at least a portion of the cathode signal line being located in the foldable region;

wherein a width of the bendable region of the at least one bendable region is in a range of 1.0 mm to 1.5 mm, inclusive; and a width of the cathode signal line is in a range of 2.0 mm to 3.5 mm inclusive.

17. The method for manufacturing the flexible display panel according to claim 16, wherein forming the bezel circuit on the flexible substrate further includes:

forming a plurality of signal lines and at least one circuit group on the flexible substrate, wherein a circuit group of the at least one circuit group includes at least one gate driving circuit located in the foldable region, the at least one gate driving circuit is configured to connect at least some of the plurality of signal lines, and the plurality of signal lines are formed in synchronization with a gate layer of thin film transistors in the gate driving circuit.

18. The method for manufacturing the flexible display panel according to claim 17, wherein forming the cathode signal line on the flexible substrate includes forming the cathode signal line on a side of the circuit group away from the display area.

* * * * *